(12) United States Patent
Schwarz et al.

(10) Patent No.: US 11,916,354 B2
(45) Date of Patent: Feb. 27, 2024

(54) LASER ASSEMBLY, SPECTROMETER AND METHOD FOR OPERATING A LASER

(71) Applicant: TECHNISCHE UNIVERSITÄT WIEN, Vienna (AT)

(72) Inventors: Benedikt Schwarz, Vienna (AT); Johannes Hillbrand, Vienna (AT); Gottfried Strasser, Vienna (AT)

(73) Assignee: TECHNISCHE UNIVERSITÄT WIEN, Vienna (AT)

( * ) Notice: Subject to any disclaimer, the term of this patent is extended or adjusted under 35 U.S.C. 154(b) by 572 days.

(21) Appl. No.: 17/266,374

(22) PCT Filed: Aug. 9, 2019

(86) PCT No.: PCT/EP2019/071387
§ 371 (c)(1),
(2) Date: Feb. 5, 2021

(87) PCT Pub. No.: WO2020/030772
PCT Pub. Date: Feb. 13, 2020

(65) Prior Publication Data
US 2021/0313775 A1    Oct. 7, 2021

(30) Foreign Application Priority Data

Aug. 10, 2018  (EP) .................................... 18188432

(51) Int. Cl.
*H01S 5/0625* (2006.01)
*H01S 5/00* (2006.01)
(Continued)

(52) U.S. Cl.
CPC ........ *H01S 5/06255* (2013.01); *H01S 5/0085* (2013.01); *H01S 5/0657* (2013.01); *H01S 5/3402* (2013.01); *H01S 5/005* (2013.01)

(58) Field of Classification Search
CPC .................................................. H01S 5/06255
(Continued)

(56) References Cited

U.S. PATENT DOCUMENTS

2002/0050596 A1*  5/2002  Otsuka ................ H01S 5/04256
257/E27.12

OTHER PUBLICATIONS

European Search Report EP 18188432.1 dated Feb. 20, 2019.
(Continued)

*Primary Examiner* — Tuan N Nguyen
(74) *Attorney, Agent, or Firm* — Daniel J. Chalker; Edwin S. Flores; Chalker Flores, LLP

(57) ABSTRACT

A laser assembly comprising: a semiconductor laser with a fast gain medium, wherein the gain relaxation time of the gain medium is smaller than the round-trip time in a standing wave cavity; a DC source coupled to the standing wave cavity; and an AC injection device for injecting an electrical AC signal within a range and/or within an integer multiple of the range into the standing wave cavity, the range within ±1% of the natural round-trip frequency in the standing wave cavity, comprising at least a first and second electric contact section extending along a first longitudinal side of the longitudinal extension of the standing wave cavity, the AC injection device coupled to the first and/or second electric contact section such that the complex amplitude of the electrical AC signal differs for the first and second longitudinal electric contact section.

18 Claims, 11 Drawing Sheets

(51) Int. Cl.
*H01S 5/065* (2006.01)
*H01S 5/34* (2006.01)

(58) Field of Classification Search
USPC ...................................................... 372/43.01
See application file for complete search history.

(56) References Cited

OTHER PUBLICATIONS

Derickson, Dennis J. et al. "Short Pulse Generation Using Multisegment Mode-Locked Semiconductor Lasers" IEEE Journal of Quantum Electronics, vol. 28, No. 10, Oct. 1992.
Hugi, Andreas et al. "Mid-infrared frequency comb based on a quantum cascade laser" Dec. 13, 2012, vol. 492, Nature, pp. 229-233.
Piccardo, Marco et al. "Time-dependent population inversion gratings in laser frequency combs" Optica, vol. 5, No. 4, Apr. 2018, 4 pages.
Schwarz, Benedikt et al. "A monolithic frequency comb platform based on interband cascade lasers and detectors" physics.optics, Dec. 10, 2018.
Wang, Christine Y. et al. "Mode-locked pulses from mid-infrared Quantum Cascade Lasers" Jul. 20, 2009, vol. 17, No. 15, Optics Express, pp. 12929-12943.
Wang, Yin et al. "High-resolution multi-heterodyne spectroscopy based on Fabry-Perot quantum cascade lasers" Applied Physics Letters. 104, (Jan. 20, 2014) 8 pages.

\* cited by examiner

LASER ASSEMBLY, SPECTROMETER AND METHOD FOR OPERATING A LASER

CROSS-REFERENCE TO RELATED APPLICATIONS

This application claims priority to and is a National Stage Patent Application of International Application No. PCT/EP2019/071387, filed on Aug. 9, 2019, which claims priority to EP 18188432.1, filed on Aug. 10, 2018, the contents of each of which is incorporated by reference herein.

TECHNICAL FIELD OF THE INVENTION

The present disclosure concerns a laser assembly comprising a laser with a fast gain medium, in particular a quantum cascade laser (QCL) or an interband cascade laser (ICL), and a standing wave cavity; a DC source coupled to the standing wave cavity for pumping the laser; an AC injection device for injecting an electrical AC signal into the standing wave cavity and optionally a grounded substrate.

The present disclosure further concerns a spectrometer for frequency comb spectroscopy of an analyte.

Furthermore, the present disclosure concerns a method of operating a laser with a fast gain medium, in particular a quantum cascade laser or an interband cascade laser, and a method of frequency comb spectroscopy.

BACKGROUND OF THE INVENTION

Optical frequency combs are lasers whose spectrum consists of a multitude of equidistant lines. Optical frequency combs have already been applied to a variety of technologies, such as time metrology, frequency synthesis and high-precision spectroscopy. Especially in the mid-infrared spectral region (MIR), there are opportunities for application in analytical chemistry. Its impact on fields beyond laser dynamics is evident. Dual comb spectroscopy could lead to a breakthrough in miniaturization and chemical sensing technology. Dual comb spectroscopy allows the simultaneous down-conversion of a multitude of spectral lines from the optical to the radio-frequency domain, where it can be analysed by state-of-the-art electronics.

Past experiments led to the belief that electrical injection locking destroys the coherence of frequency modulated (FM) comb states and that only parts of the spectrum can be locked, and that the full coherence and/or the phase characteristics of a free-running semiconductor laser frequency comb cannot be maintained. Furthermore it is known that optical feedback has a fatal effect on free-running semiconductor frequency combs. The complexity and fragility of dual-comb spectrometers based on semiconductor frequency combs currently limits their versatility. In conventional dual-comb setups, expensive and narrowband mid-infrared optical isolators have to be used to mitigate the effect of optical feedback and ensure stable comb operation. Such optical isolators are bulky and thus prohibit miniaturization.

To date, semiconductor laser frequency combs have been realized mostly by mode-locking, where the laser modes are synchronized in such a way that the intermodal difference phases are constant and thus, short optical pulses are generated. As another type, quantum cascade laser frequency combs are realized via minimization of the laser cavity dispersion. The dynamics and non-linear processes of this type of laser lead to a very different phase locking mechanism, which does not lead to short pulse generation and herein is referred to as FM type comb. The consequence of excessive dispersion is mainly that the laser does not operate in the frequency comb regime over the whole range of laser bias, but rather in a regime with drastically increased phase-noise. In order to avoid this regime, the dispersion of the laser cavity has to be minimized. Nevertheless, not even dispersion compensated lasers work as frequency combs over their whole dynamic range currently. So far, the only solution to avoid destabilization via optical feedback is to attenuate the laser beam by a high factor (e.g. at least 100), which of course also limits the sensitivity and accuracy of sensing applications, as well as the miniaturization of the sensing device.

The article "Mid-infrared frequency comb based on a quantum cascade laser" in Nature 492, 229-233, by Hugi et al. (2012) shows a semiconductor frequency comb generator that operates in the mid-infrared and that the modes of a continuous-wave, free-running, broadband QCL are phase-locked. It was asserted that while operating in the comb regime, their laser does not show short pulse generation and explained that four-wave mixing can couple the modes in a Fabry-Perot laser with a low cavity dispersion and that the fast gain dynamics of QCLs and the requirement of continuous wave operation limits their applicability when it comes to battery driven applications.

The article "Short Pulse Generation Using Multisegment Mode-Locked Semiconductor Lasers" in IEEE Journal of Quantum Electronics, Vol. 28, No. 10, by Derickson et al. (1992) describes short pulse generation using multiple-segment semiconductor laser structures. Therein, the laser comprises a section with a slow gain medium and a section proximate to an end of a the laser cavity with a fast absorber medium. In this setup, a multisegment laser structure is used, because as a problem in a single segment device it is identified that it would be difficult to get short single pulse outputs from the laser and secondary pulses spaced at the round-trip time in the laser diode would often be generated. It is stated that for external cavity geometries by separating the gain and gain modulation functions into two separate locations, the multiple pulsation problem can be suppressed. In this publication, due to the use of a slow gain medium, the intermode beatings of adjacent modes are locked in phase. Furthermore, due to the fact that a laser with a slow gain medium is used, the effect of the electrical beat-note and its spatial pattern is negligible for the mode-locking in this setup, because the gain dynamics are too slow to follow the modulation of the intracavity light intensity. For this reason, the findings of this publication cannot be translated into an improvement for lasers with a fast gain medium.

The article "Time-dependent population inversion gratings in laser frequency combs" in Optica, Vol. 5, No. 4, by Piccardo et al (April 2018) describes that the modes of a quantum cascade laser frequency comb coherently beat to produce time-dependent population inversion gratings, which spatially modulate the current in the device at frequencies equal to the mode separation and its higher harmonics. It mentions the electrical beat-note produced by the intermodal beating of adjacent cavity modes and the spatial dependence of both amplitude and phase of the beat signal across the laser cavity. It is shown that the electrical beat-note power patterns exhibit antinodes at the edges of the cavity and a number of nodes equal to the order of the intermodal beat-note and that the corresponding phase profiles show a smooth phase transition between 0 and pi ($\pi$) at the positions of the power nodes, indicating that adjacent lobes of the power profile oscillate in antiphase. However this paper does not suggest in any way how the frequency comb could be injection locked.

BRIEF SUMMARY OF THE INVENTION

It is a goal of the present disclosure to at least alleviate one or more of the drawbacks of the state of the art. In particular, it is a goal of the present invention to provide a method and device comprising at least one of the following characteristics: a compact source of optical frequency combs, providing the possibility for miniaturization and enabling the use for miniaturized optical spectrometers, that is cost-effective, has low power requirements, is suitable for MIR spectroscopy, enables stabilization of forced FM type combs, free-running FM type combs or FM type combs operating in the high phase noise regime, while maintaining the intermodal coherence and/or phase profile, in particular to make them more robust against various type of noise, fluctuations and drifts, as well as optical feedback, enabling much simpler optical setups without the need of optical insulators, is all-electrical, and/or enables dual-comb spectrometers, where a part of the emitted light is reflected back from the scene that contains the analyte into the lasers, that is scalable and can potentially be realized on a single chip.

This is achieved by a laser assembly as defined in the outset, wherein the laser assembly comprises at least a first and a second electric contact section extending along a first longitudinal side of the standing wave cavity, wherein the AC injection device is coupled to the first and/or to the second electric contact section such that the complex amplitude of the injected electrical AC signal differs for the first and the second longitudinal electric contact section. Furthermore this is achieved by a spectrometer for frequency comb spectroscopy of an analyte, wherein the spectrometer comprises a first laser assembly as disclosed herein.

This is also achieved by a method of operating a laser as defined in the outset, wherein the method comprises at least the steps of:
generating standing optical waves in a standing wave cavity of the laser, wherein an electrical laser beat-note with a spatially dependent amplitude is generated,
pumping the laser with a DC current from a DC source coupled to the standing wave cavity,
injecting an electrical AC signal into the standing wave cavity with an AC injection device such that the spatial pattern of the injected electrical AC signal corresponds to the spatially dependent amplitude of the electrical laser beat-note along the longitudinal extension of the standing wave cavity;
and by a method for frequency comb spectroscopy, wherein a first laser with a fast gain medium, in particular a QCL or an ICL, is operated as disclosed herein.

In another embodiment, as defined in claim 1, the method of operating a semiconductor laser with a standing wave cavity with a fast gain medium, wherein the gain relaxation time of the gain medium is smaller than the round-trip time in the standing wave cavity, in particular a quantum cascade laser or an interband cascade laser, comprises at least the steps of:
generating standing optical waves in the standing wave cavity of the laser, wherein an electrical laser beat-note with a spatially dependent amplitude is generated,
pumping the laser with a DC current from a DC source coupled to the standing wave cavity,
injecting an electrical AC signal into the standing wave cavity with an AC injection device to stabilize an optical frequency comb such that the spatial pattern of the injected electrical AC signal corresponds to the spatially dependent amplitude of the electrical laser beat-note along the longitudinal extension of the standing wave cavity, wherein the injected electrical AC signal is within a range and/or within an integer multiple of the range, wherein the range is within ±1% of the natural round-trip frequency in the standing wave cavity.

In another embodiment, as defined in claim 10, the laser assembly comprises:
a semiconductor laser with a fast gain medium, wherein the gain relaxation time of the gain medium is smaller than the round-trip time in the standing wave cavity, in particular a quantum cascade laser or an interband cascade laser, and a standing wave cavity;
a DC source coupled to the standing wave cavity for pumping the laser; and
an AC injection device for injecting an electrical AC signal into the standing wave cavity to stabilize an optical frequency comb, the AC injection device being suitable for producing an electrical AC signal within a range and/or within an integer multiple of the range, wherein the range is within ±1% of the natural round-trip frequency in the standing wave cavity,
characterized by
at least a first and a second electric contact section extending along a first longitudinal side of the longitudinal extension of the standing wave cavity, wherein the AC injection device is coupled to the first and/or to the second electric contact section such that the complex amplitude of the injected electrical AC signal differs for the first and the second longitudinal electric contact section.

This approach is based on the insight that the signal used for injection locking has to be adjusted to the spatially dependent amplitude of the electrical laser beat-note and thus should not be same over the whole longitudinal extension of the standing wave cavity. A semiconductor laser shows a natural beating around the laser's round-trip frequency, which shows characteristic spatial patterns. With an external electric modulation with suitable spatial and temporal characteristics, this beating can be synchronized to generate or stabilize an optical frequency comb, where the phases of the individual beat oscillation of adjacent laser lines (intermodal phases) are locked by repulsive means, i.e. the phases of the beatings do not tend to synchronize to the same phase as is the case of active mode locking.

These devices and methods enable the generation of optical frequency combs with QCLs and with ICLs, where the intermodal phases do not tend to be synchronized to the same phase. Furthermore, they enable their stabilization and make them more robust against various kinds of noise, fluctuations and drifts of the environment, and optical feedback. The enhanced robustness enables simplified optical setups, i.e. where a part of the light is back-reflected to the laser, which could hardly be used without this devices or methods, because the feedback would destabilize the frequency comb.

Under fast gain medium is understood a gain medium, wherein the gain relaxation time, i.e. gain recovery time, of the gain medium is smaller than the round-trip time in the standing wave cavity. Experiments by the applicant have shown that ICLs indeed make up fast gain media (as was already known for QCLs). Fast gain media result in a high cut-off frequency for the modulation of the driving current, resulting in the electrical beating and electrical laser beat-note already mentioned. Experiments have furthermore shown that the spatially dependent amplitude of the electrical laser beat-note in a standing wave cavity has substantially the form of a cosine curve from 0 to pi from one end of the standing wave cavity to the other end of the standing wave cavity. This is in particular a result of the boundary conditions. Its n-th harmonic has substantially the form of a cosine curve from 0 to n*pi from one end of the standing wave cavity to the other end of the standing wave cavity. The precise spatial profile for every harmonic can be calculated straightforwardly as described in Piccardo et al. in Optica (2018). The standing wave cavity can be a single or a multi-section laser cavity. In particular, the standing wave cavity is a Fabry-Perot interferometer/cavity. In particular it comprises one partially reflective mirror at each of its ends, which can also be seen as its outputs, i.e. output couplers. (However, a beam can also be coupled in through an output, as happens e.g. in the case of optical feedback.) The mirror at one of the ends can also be substantially totally reflective. Under longitudinal extension of the standing wave cavity is understood the direction of propagation of the laser beam within the standing wave cavity. The complex amplitude can be characterized by its absolute value and its argument. The argument of the complex amplitude of the injected AC signal is herein referred to as the phase of the injected AC signal. When referring to the complex amplitude this refers to its absolute value and/or its argument, i.e. phase. The DC source is a DC voltage and/or current source.

In particular, the laser has a laser chip defining the standing wave cavity via its facets, or, in other words, the laser is a (semiconductor, preferably QCL or ICL) laser chip having a/the standing wave cavity delimited by its facets. The facets can be coated or uncoated.

The AC signal injected into the standing wave cavity has a power of preferably less than 20 dBm, more preferably less than 15 dBm, even more preferably less than 10 dBm, 5 dBm or 1 dBm. Advantageously, the AC signal is injected such that a continuous wave or a quasi-continuous wave is generated, i.e. such that no short pulses are generated. In particular, the AC signal is injected such that the emitted laser light has a duty cycle of at least 50%, more preferably 75%, even more preferably 90%. Under duty cycle is understood the fraction of time where the emitted laser power exceeds 5% of the maximal laser power during a cavity roundtrip period. Preferably, the method of operating a laser comprises the step of generating an optical frequency comb with the laser before the step of injecting an electrical AC signal into the standing wave cavity. The electrical AC signal is injected into the standing wave cavity such that the phase difference of adjacent comb lines covers a range of preferably 0.8*2π, more preferably 0.9*2π, even more preferably substantially 2π, from the lowest to the highest frequency mode. Preferably, under fast gain medium is understood a gain medium, wherein the gain relaxation time of the gain medium is multiple times, i.e. preferably at least 2 times, more preferably at least 5 times, even more preferably at least 15 times, smaller than the round-trip time in the standing wave cavity. Operating a laser with such a gain medium ensures the generation of a frequency comb before injecting an AC signal, such that the frequency comb can subsequently be stabilized. The upper state lifetime of the gain medium of the laser is preferably less than 15 ps, more preferably less than 10 ps, even more preferably less than 5 ps. Preferably, the laser is pumped such that the total losses of the laser do not exceed the total gain of the laser by more than 50 percent over a cavity roundtrip period.

Preferably the laser assembly comprises a grounded (in particular conducting) surface, in particular a grounded (in particular conducting) substrate, in particular extending along a second longitudinal side of the standing wave cavity, preferentially along substantially the whole longitudinal extension of the standing wave cavity. Preferably the second longitudinal side is extending opposite the first longitudinal side of the standing wave cavity.

Referring to the method of operating a laser with a fast gain medium, injecting an electrical AC signal into the standing wave cavity with an AC injection device such that the spatial pattern of the injected electrical AC signal corresponds to the spatially dependent amplitude of the electrical laser beat-note along the longitudinal extension of the standing wave cavity means that within one longitudinal interval of the standing wave cavity the complex amplitude of the injected electrical AC signal should be adjusted to the complex amplitude of the electrical beat-note at at least one point within that longitudinal interval and for at least one other longitudinal interval it should comprise a different complex amplitude and be adjusted to the complex amplitude of the electrical beat-note at at least one point within that one other longitudinal interval.

Referring to the laser assembly, it is preferable if the AC injection device is coupled to the first and/or the second electric contact section such that the absolute value of the complex amplitude of the injected electrical AC signal differs for the first and the second electric contact section by at least 10%, preferably by at least 30%, more preferably by at least 50%, with respect to the higher absolute value of the complex amplitude. In particular it is preferable if the absolute value of the complex amplitude is substantially zero at one of the electric contact sections, whereas it is non-zero for at least one other electric contact section (i.e. they differ by substantially 100% of the absolute value of the complex amplitude of the higher absolute value of the complex amplitude).

In a preferred embodiment of the laser assembly, the AC injection device is coupled to the first and/or the second electric contact section such that the phase of the injected electrical AC signal differs for the first and the second electric contact section by between 90° and 270°, preferably by between 135° and 225°, more preferably by substantially 180°.

Preferably, the length of the first and/or second of the electric contact section is at least 5% of the longitudinal extension of the standing wave cavity, i.e. of the length of the standing wave cavity, and/or the length of the first and/or second electric contact section is less than 95% of the longitudinal extension of the standing wave cavity. For example, the first electric contact section could extend from one end of the standing wave cavity to a center (regarding the longitudinal extension of the standing wave cavity) of the standing wave cavity and the second electric contact section from the center of the standing wave cavity to the other end of the standing wave cavity. In particular, the electric contact sections should not overlap with regard to the longitudinal extension of the standing wave cavity.

In a preferable embodiment the AC injection device comprises an RF source, in particular an RF oscillator. There can be provided for another RF oscillator for modulating the first RF source. In particular the RF source can be a voltage controlled oscillator or a phase locked loop controlled and stabilized oscillator. Such RF oscillators can be found in every mobile phone and can be cheap, reliable and miniaturized.

Preferably, the AC injection device is suitable for producing an electrical AC signal within a range and/or within an integer multiple of the range, in particular within the range multiplied by 2, 3, 4 and/or 5, wherein the range is within ±1%, preferably within ±0.1%, more preferably within ±0.01%, even more preferably within ±0.001%, of the (natural, i.e. before injection locking has occurred) round-trip frequency in the standing wave cavity. In particular, this range should be the locking range of the laser. (The cavity round-trip frequency is given by c/2*n*L, where L is the cavity length, n is the effective refractive index of the laser cavity and c is the speed of light in vacuum.) Injection locking is the frequency effect that can occur when a harmonic oscillator (or one of its higher harmonics) is disturbed by a second oscillator operating at a nearby frequency. When the coupling is strong enough and the frequencies close enough, the second oscillator can capture the frequency of the first oscillator, causing it to have essentially identical frequency as the second and a defined phase relation between the two oscillators. Thus it is preferred, that the AC injection device is capable for producing an electrical AC signal within a range, which is close to the round-trip frequency in the standing wave cavity and thus is the locking range. In particular, the closer the produced electrical AC signal is to the round-trip frequency in the standing wave cavity, the lower the power of the injected electrical AC signal has to be to achieve sufficient injection locking. Experiments by the applicant have shown that if the injected electrical AC signal is well matched within ±0.002% around the round-trip frequency (e.g. within a range of about 200 kHz around a round-trip frequency of 11 GHz) to the natural electrical laser beat-note frequency in the standing wave cavity, a power of the injected electrical AC signal of as low as −30 dBm is sufficient.

In an advantageous embodiment, the laser assembly comprises an electric contact extending along the first longitudinal side of the standing wave cavity, preferably essentially over the whole longitudinal extension of the standing wave cavity, wherein the electric contact has at least the first electric contact section and the second electric contact section and preferably further electric contact sections, wherein the DC source is conductively connected to at least one of, preferably all, of the first, second and/or further electric contact sections. If the DC is source conductively connected to all electric contact sections and/or the electric contact extends substantially over the whole length of the standing wave cavity, the efficiency of the pumping of the laser can be maximized. In particular, the AC injection device is coupled to the electric contact sections such that it is conductively connected to at least one of the first, second and further electric contact section (there can be provided for phase shifters and/or a dampeners in the connection to some electric contact sections) and not connected to the remaining (which can be zero) electric contact sections.

It is preferable if the first and the second electric contact section, preferably also the further electric contact sections, of the electric contact are separated by substantially non-conducting splits in the electric contact. In this embodiment it is preferable if there is a thick, e.g. 2 µm thick, passivation layer between electric contact sections that are conductively connected to the AC injection device and the standing wave cavity to reduce the parasitic capacity (between the electric contact sections and the grounded substrate) and allow efficient AC, in particular RF, modulation. On the other hand, the remaining sections can comprise a thin, e.g. 150 nm thick, passivation layer, for instance comprising silicon nitride, to increase the efficiency of heat dissipation and as a result the efficiency of the laser.

In a preferable embodiment, the first and second electric contact sections, preferably also the further electric contact sections, of the electric contact are continuously connected to one another, wherein the grounded substrate and the electric contact form a capacitor with a capacitance, an imaginary part of the complex impedance (i.e. the parasitic capacity) being such that the absolute value of the complex amplitude of the injected electrical AC signal at an edge of an electric contact section is less than 10%, preferably less than 5%, of the absolute value of the complex amplitude of an electrical AC signal injected in a center, in direction of the longitudinal extension of the standing wave cavity, of the respective electric contact section. Thus in this embodiment it is preferable if there is a thin passivation layer between electric contact sections that are conductively connected to the AC injection device and the standing wave cavity to achieve a large enough parasitic capacity. In particular there should be a small passivation layer between the electric contact and the standing wave cavity, and preferentially the grounded substrate should also be close to the standing wave cavity. Thus, in this embodiment, it is not necessary that there are actual nonconducting splits in the electric conduct, which could reduce the complexity of production of the laser assembly.

In an advantageous embodiment, the AC injection device is conductively connected to one of the first or second electric contact section or further electric contact section adjacent to the one end of the standing wave cavity and preferably

- phase shifted by substantially 180° to another of the first or second electric contact section or further electric contact section adjacent to the other end of the standing wave cavity or
- to another of the first or second electric contact section or further electric contact section adjacent to the other end of the standing wave cavity and more preferably, phase shifted by substantially 180°, to a third of the first or second electric contact section or electric contact section substantially adjacent to a center, in the direction of the longitudinal extension of the standing wave cavity, of the standing wave cavity. The connection phase shifted by substantially 180° can for example be achieved by a connection via a phase shifter, or by connecting the non-shifted electric contact sections with one pole of the AC injection device and the shifted by substantially 180° electric contact sections with the other pole of the AC injection device. Due to its inherent spatio-temporal pattern, the electrical beating is the most susceptible to the injected signal at the ends of the standing wave cavity. Furthermore, taking into account the electrical laser beat-note, the injection locking could be done at both ends of the standing wave cavity with a phase shift of substantially 180°. On the other hand, if for example the second harmonic (i.e. the first higher harmonic) of the electrical laser beat-note should be injection locked, the electrical AC signal injected at the both ends of the standing wave cavity should have the same phase, while an electrical AC signal injected in the center of the cavity should have a phase shift of 180°. Under the electric contact section being adjacent to one end or to the center is understood that at least one point of that electric contact section should be in close proximity to that end or to the center of the standing wave cavity. As such an example of an electric contact section being adjacent to one end would be an electric contact section spanning from that end to the center of the standing wave cavity.

In a preferable embodiment, the AC injection device is conductively connected to one or more electric contact sections such that each electric contact section that the AC injection device is conductively connected to extends over a local maximum of a defined curve, which corresponds to the spatially dependent amplitude of the electrical laser beat-note or one of its higher harmonics or is a half-pi cosine curve from one end of the standing wave cavity to the other end of the standing wave cavity or one of its higher harmonics, and preferentially the AC injection device is, phase shifted by substantially 180°, conductively connected to one or more electric contact sections such that each such electric contact section extends over a local minimum of the defined curve. As such, the injected electrical AC signal is very well adjusted to the electrical laser beat-note and injection locking can be achieved effectively. In this context, corresponding means that the injected electrical AC signal is adjusted to positively support/promote the amplitude of the electrical laser beat-note. Usually the value at the local minimum/minima will be the negative of the value at the local maximum/maxima.

Referring now again to the spectrometer disclosed herein, it is advantageous to use a first laser assembly according to any embodiment of the laser assembly disclosed herein, because this laser assembly achieves injection locking that is significantly more stable against noise, fluctuations and drifts, as well as optical feedback, enabling much simpler optical setups without the need of optical insulators and thus miniaturization.

It is preferable, if some or all of the spectrometer's components are implemented on a chip, more particularly on a die (in its meaning in the context of integrated circuits, i.e. a small block of semiconducting material on which a given functional circuit is fabricated). As such the production costs of the spectrometer, as well as its size, could be drastically reduced. Thus, for example the usage of the spectrometer in a handy measuring device or a smart watch or smart phone is possible.

It is advantageous if the spectrometer comprises a modulation oscillator for frequency modulating the AC injection device of the first laser assembly. The electrical laser beat-note and thus the repetition frequency (which is equivalent to the round-trip frequency) of the laser is determined by the frequency of the AC injection device used for injection locking. Thus, by modulating the frequency of the AC injection device in time, e.g. by a rectangular signal, the distance between the teeth of the frequency comb can be changed and adjusted for frequency comb spectroscopy.

In an advantageous embodiment, the spectrometer comprises:
an interaction zone for interacting a first beam emitted from the first laser assembly with an analyte,
optionally a temporally delaying element, preferably a multipass cell (which could for example also comprise the interaction zone), for time delaying the first beam,
optionally a detector,
particularly preferably the modulation oscillator.

Thus the first beam emitted from the first laser assembly can be interacted with the analyte, optionally time delayed, and finally multiheterodyne beating could be detected either in the first laser assembly itself, if the first beam is redirected into the first laser assembly, e.g. by an optical component for directing the first beam into the first laser assembly, or in the detector. The first beam is optionally shone through a delaying element, which delays the first beam by a time $\Delta t$, wherein $\Delta t$ is preferably more than 0.1% of, more preferably more than 1% of, even more preferably substantially 50% of, the modulation frequency $\tau$. The time delaying element might be a multipass cell and may comprise the interaction zone.

In the advantageous embodiment mentioned lastly, it is preferable it the spectrometer further comprises:

a beam splitter for splitting off a second beam from the first beam and
a beam combiner for combining the first beam and the second beam (in particular after the first beam has passed the interaction zone and optionally the time delaying element).

Herein, it is preferably if the beam combiner directs the first and the second beam at the detector (or alternatively back into the first laser assembly), where the multiheterodyne beating can be detected. A multiheterodyne beating is formed, because the light from the first beam has a slightly different intermodal difference frequency as the light from the second beam. This multiheterodyne beating enables spectroscopic examination of the analyte.

In an advantageous embodiment, the spectrometer comprises:
preferably a collimating lens for collimating an initial beam exiting the first laser assembly,
a beam splitter for splitting the initial beam into a first and a second beam,
optionally a temporally delaying element, preferably a multipass cell, for time delaying the first beam,
preferably an interaction zone for an interaction between the first beam or the second beam with an analyte.
a beam combiner, preferably the beam splitter, for combining the first and the second beam, and
preferably a detector for detecting multiheterodyne beating.

In this embodiment, it is particularly preferable if the spectrometer comprises the modulation oscillator mentioned above for modulating the frequency of the AC injection device. Defining the period of the frequency modulation as tau ($\tau$), one can then split the initial beam from the first laser assembly with the beam splitter into a first and a second beam and consecutively shine e.g. the first beam through a delaying element, which delays the first beam by a time $\Delta t$, wherein $\Delta t$ is preferably more than 0.1% of, more preferably more than 1% of, even more preferably substantially 50% of, the modulation frequency $\tau$. The time delaying element might be a multipass cell and may comprise the interaction zone. The first and the second beam are then combined e.g. on a detector. A multiheterodyne beating is formed, because the light from the first beam has a slightly different intermodal difference frequency as the light from the second beam. This multiheterodyne beating enables spectroscopic examination of the analyte. It is also possible that the multiheterodyne beating is detected in the laser itself and not on an external detector. As such this embodiment is a particularly simple implementation of a spectrometer for frequency comb spectroscopy.

Preferentially, the spectrometer comprises a second laser assembly according to any embodiment mentioned in this disclosure.

In a preferable embodiment, the spectrometer comprises an optical arrangement for directing a first beam from an output of the first laser assembly into an output of a second laser assembly and preferentially a second beam from the output of the second laser assembly into the output of the first laser assembly, preferably an RF spectrum analyzer connected to at least one electric contact section of the first laser assembly and preferably an interaction zone for an interaction between the first beam and/or the second beam with an analyte. This embodiment makes self-detected dual comb spectroscopy possible, which is particularly compact. Thus, an external detector is not necessary for detecting the dual-comb beating of two frequency combs. Instead, it is possible to shine the light of one frequency comb into another frequency comb and extract the beating directly through one or more of the electric contact section receiving the injected electrical AC signal with the RF spectrum analyzer. This is possible, because the laser assemblies of this embodiment are very robust against optical feedback. In particular, this can be realized with the two laser assemblies implemented on the same chip, a lens for focusing and a mirror. The region between the one (or both) outputs and the mirror can contain the analyte. The beam emitted from the output of one of the laser assemblies is collimated by the lens onto the mirror and then again collimated by the lens into the other laser assembly. The mirror and lens can also be replaced by a curved mirror. The multiheterodyne beating consists of several narrow lines corresponding to pairs of lines of the two frequency combs, one from each laser assembly. If one of the two laser assemblies were not stabilised as described in this disclosure or is unlocked by detuning the injection frequency, the well-defined lines vanish and only a broad peak without individual lines remains; such an unlocked multiheterodyne beating limits the applicability for spectroscopy.

It is advantageous if the spectrometer comprises:
a first detector and a first optical arrangement for directing a first beam from a first output of the first laser assembly into a first detector and for directing a second laser beam from a first output of the second laser assembly to the first detector,
preferably a second detector and a second optical arrangement for directing a third beam from a second output of the first laser assembly into a second detector and for directing a fourth laser beam from a second output of the second laser assembly to the second detector,
preferably a first interaction zone for an interaction between the first and/or the second beam with an analyte, and
preferably a second interaction zone for an interaction between the fourth and/or the third beam with a reference sample.

This configuration is particularly suited for being integrated on a chip, thus having the advantage that it is less sensitive against various environmental conditions, e.g. temperature fluctuations. Using laser assemblies as disclosed herein and thus improved injection locking of the frequency combs mitigates the effect of strong optical feedback that is omnipresent in on-chip optics. The first and/or the second optical arrangement can be integrated on chip, e.g. comprises on-chip dielectric and/or plasmonic waveguides, external optical fibre waveguides and/or comprise free-space optical elements such as lenses, mirrors and beam splitters. By shining two laser beams from different laser assemblies into one detector, it is possible to measure the multiheterodyne beating of the light that preferably interacted with an analyte for the first detector and that did not interact with an analyte for the second detector. This enables the precise spectroscopic examination of the analyte by dual-comb techniques. For example, the detectors and the optical arrangement are arranged such that the respective beams enter them from the same side. In this case, the stabilization against optical feedback of the laser assemblies as disclosed herein allows configurations, where a part of the beam focused onto the detector from one laser assembly is partially reflected to the laser assembly or also fed into the other laser assembly, e.g. if the laser assemblies and the detector are spatially close.

Referring now again to the method of operating a laser with a fast gain medium, the electrical AC signal is in particular injected such that it is adjusted/corresponds to nodes and antinodes, i.e. local maxima and local minima, of the spatially dependent amplitude of the electrical laser beat-note along the longitudinal extension of the standing wave cavity. Instead of adjusting it to the amplitude of the electrical laser beat-note, it can be adjusted to any of the possibilities for the above mentioned defined curve. In this context, corresponding means that the injected electrical AC signal is adjusted to positively support/promote the amplitude of the electrical laser beat-note.

In an advantageous variant of the method, the injected electrical AC signal is injected into the standing wave cavity such that the absolute value of the complex amplitude of the injected electrical AC signal varies over the longitudinal extension of the standing wave cavity by at least 10%, preferably by at least 30% percent, even more preferably by at least 50%, with respect to the absolute value of the complex amplitude at a location over the longitudinal extension of the standing wave cavity with the maximum absolute value of the complex amplitude. For example, the absolute value of the complex amplitude of the injected electrical AC signal could be zero at some position over the longitudinal extension of the standing wave cavity and be non-zero at some other position over the longitudinal extension of the standing wave cavity.

Advantageously, the phase of the injected electrical AC signal varies over the longitudinal extension of the standing wave cavity by between 90° and 270°, preferably between 135° and 225°, more preferably by substantially 180°. I.e. preferably, the injected electrical AC signal has phases with a phase shift of 180° at different position over the longitudinal extension of the standing wave cavity. As such the injected electrical AC signal is adjusted to the nodes and antinodes of the spatially dependent amplitude of the electrical laser beat-note comprising substantially opposite phases.

Preferably, the AC injection device is coupled to at least a first and a second electric contact section extending along a first longitudinal side of the standing wave cavity such that the absolute value of the complex amplitude and/or the phase of the injected electrical AC signal differs for the first and the second electric contact section. For example, the electrical AC signal can be injected into the standing wave cavity with the AC injection device such that the injected electrical AC signal is adjusted over the longitudinal extension of the standing wave cavity to the amplitude of the electrical laser beat-note by conductively connecting the AC injection device to the first electric contact section and not connecting it to the second contact section and injecting the electrical AC signal. Preferably, there is provided for more than two electric contact sections and the AC injection device is conductively connected to one, some or all of the electric contact sections.

In an advantageous variant, the electrical AC signal is injected to an electric contact section adjacent to the one end of the standing wave cavity and preferably
phase shifted by substantially 180° to another electric contact section adjacent to the other end of the end of the standing wave cavity or
to another electric contact section adjacent to the other end of the standing wave cavity and more preferably, phase shifted by substantially 180°, to a third one of the electric contact sections substantially adjacent to a center region of the standing wave cavity in the direction of the longitudinal extension of the standing wave cavity.

Thus, the injected electrical AC signal is particularly well adjusted to the spatially dependent amplitude of the electrical laser beat-note or its second harmonic and resulting therefrom the injection locking occurs particularly effective.

It is preferable if the electrical AC signal is injected to one or more of the first, second and further electric contact sections (of the standing wave cavity corresponding to a local maximum of a defined curve, which corresponds to the spatially dependent amplitude of the electrical laser beat-note or one of its higher harmonics or is a half-pi cosine curve from one end of the standing wave cavity to the other end of the standing wave cavity or one of its higher harmonics, and preferably the electrical AC signal is injected, phase shifted by 180°, to one or more of the first, second and further electric contact sections of the standing wave cavity corresponding to a local minimum of the defined curve.

It is advantageous if the electrical AC signal is injected with a frequency within a range and/or within an integer multiple of the range, in particular within the range multiplied by a factor of 2, 3, 4 and/or 5, wherein the range is within ±1%, preferably within ±0.1%, more preferably within ±0.01%, even more preferably within ±0.001, of the round-trip frequency in the standing wave cavity. As such, the absolute value of the complex amplitude of the injected electrical AC signal can be lower, since the frequency of the injected electrical AC signal is well adjusted to the frequency of the round-trip in the standing wave cavity.

Referring now again to the method for frequency comb spectroscopy, wherein a first laser with a fast gain medium, in particular a QCL or an ICL, is operated according to one of its variants of operating such a laser as disclosed herein. One particular advantage of this method for frequency comb spectroscopy is that the significantly increased stability of the operated laser against optical feedback can be utilized and that it allows miniaturization.

In a preferable variant of the method for frequency comb spectroscopy, the method comprises the steps of:
a) emitting a first beam from the first laser,
b) interacting the first beam with an analyte,
c) optionally time delaying the first beam,
d) directing the first beam at the standing wave cavity of the first laser or at a detector,
e) detecting multiheterodyne beating in the standing wave cavity of the first laser or in the detector,
f) repeating steps a) to e) while modulating the frequency of the injected electrical AC signal.

Therein, in particular the order for step b) and c) can be changed or step c) can be split up and partially be performed between steps a) and b) and partially be performed between steps b) and d). Herein it is particularly preferable to detect the multiheterodyne beating in the standing wave cavity of the first laser assembly, since thus no additional external detector is required.

Advantageously, in the preferable variant mentioned last,
step a) comprises splitting a second beam off the first beam after emitting the first beam from the first laser and
step d) also comprises directing the second beam at the standing wave cavity of the first laser or at the detector.

Herein, it is particularly preferred to detect multiheterodyne beating of the first and the second beam in the detector.

In an advantageous variant of the method for frequency comb spectroscopy, the method comprises the steps:
a) emitting an initial beam from the first laser,
b) splitting the initial beam into a first beam and a second beam,
c) time delaying the first beam,
d) preferably interacting the first beam or the second beam with an analyte,
e) combining the first beam and the second beam,
f) interacting the first beam and the second beam in a detector or in the standing wave cavity of the laser, and
g) preferably repeating the steps a) to f) while modulating the frequency of the injected electrical AC signal.

Thus the first and the second beam form a delayed and a substantially undelayed beam, which are then combined e.g. on the detector. A multiheterodyne beating is formed, because the delayed light has a slightly different intermodal difference frequency as the substantially non-delayed light. This multiheterodyne beating enables spectroscopic examination of the analyte using dual-comb techniques. It is also possible that the multiheterodyne beating is detected in the laser itself and not on an external detector. Thus this allows frequency comb spectroscopy with a single frequency comb generating laser and without the need for complex optical insulators. By repeating the steps a) to f) while modulating the frequency of the injected electrical AC signal, a spectrum of the absorption of the analyte can be measured.

It is advantageous if the method comprises the steps:
operating a second laser with a fast gain medium, in particular a QCL or an ICL, according to any of the variants for operating such a laser disclosed herein,
emitting a first beam from an output of the first laser,
emitting a second beam from an output of the second laser,
preferably interacting the first beam and/or the second beam with an analyte
directing the first beam into the output of the second laser,
preferably directing the second beam into the output of the first laser,
preferably measuring multiheterodyne beating at at least one electric contact section where the electrical AC signal was injected of the first and/or the second laser.

As such the frequency comb spectroscopy can be conducted without the need for an external detector to detect the dual comb beating of the two combs. Instead, it is possible to shine the light of one comb into another comb and extract the beating directly through at least one electric contact section, in particular at least one where the electrical AC signal was injected. The steps of directing the first beam into the output of the second laser and/or of directing the second beam into the output of the first laser can be conducted e.g. with a lens and a mirror or a curved mirror, with an on-chip waveguide and/or with an optical fibre waveguide.

In a preferable variant, the method comprises the steps:
operating a second laser with a fast gain medium, in particular a QCL or an ICL, according any of the variants for operating such a laser as disclosed herein,
emitting a first beam from a first output of the first laser,
emitting a second beam from a first output of the second laser,
preferably interacting the first and/or the second beam with an analyte,
directing the first beam to a first detector,
directing the second beam to the first detector, and
preferably emitting a third beam from a second output of the first laser, emitting a fourth beam from a second output of the second laser, preferentially interacting the third and/or the fourth beam with a reference sample, directing the third beam to a second detector and directing the fourth beam to the second detector.

This method of frequency comb spectroscopy, in particular dual comb spectroscopy, has the advantage that it is less sensitive against various environmental conditions, e.g. temperature fluctuations. Using lasers operated as disclosed herein mitigates the effect of strong optical feedback that is for example omnipresent in on-chip optics.

Therein, preferably, the first laser, the second laser, the first detector and the second detector are provided integrated on the same chip.

BRIEF DESCRIPTION OF THE DRAWINGS

In the following, the disclosure shall be further explained with figures, which show advantageous embodiments and variants and shall in no way be construed to be limiting to the claims. The figures show in detail:

DETAILED DESCRIPTION OF THE INVENTION

Figure 1:
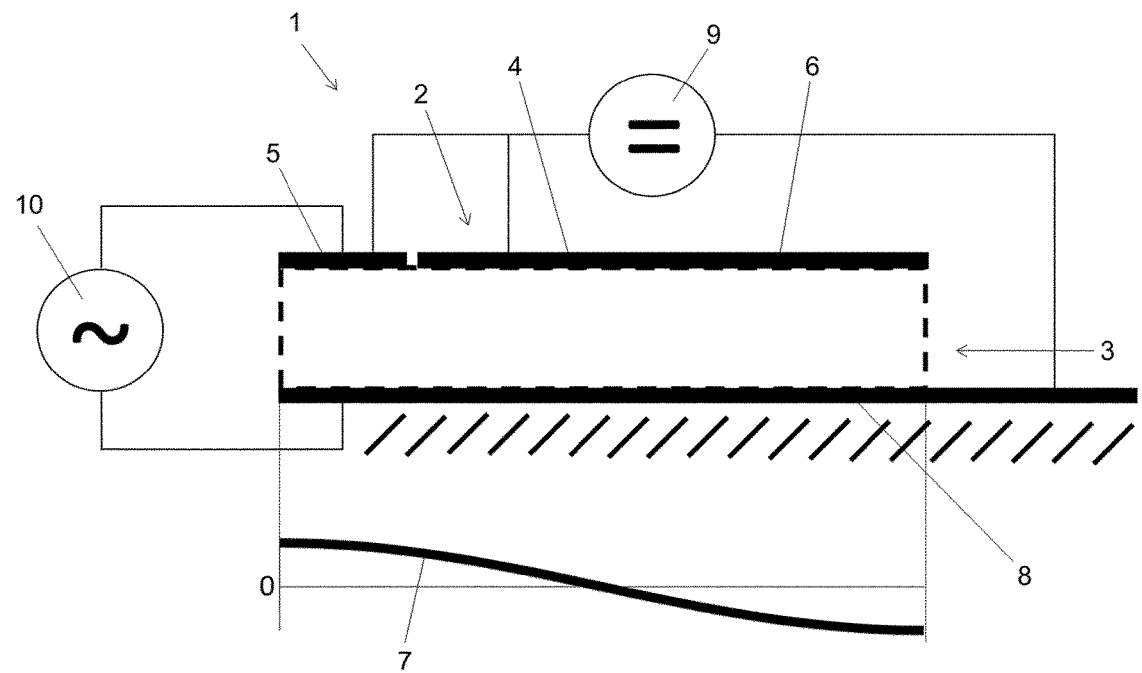
FIG. 1 a schematic diagram of an embodiment of a laser assembly with two electric contact sections.

FIG. 1 shows a preferable embodiment of the laser assembly 1 with a laser 2 with a fast gain medium and a standing wave cavity 3. Each end of the standing wave cavity 3, which is a Fabry-Perot cavity, comprises a partially transparent mirror. Below the laser assembly is the real part of the spatially dependent complex amplitude 7 of the electrical laser beat-note shown in an idealised schematic as a half-cosine curve from one end of the standing wave cavity 3 to its other end with its extrema at each end. This curve, as well as its higher harmonics, are a result of the boundary conditions in the standing wave cavity 3.

The laser assembly 1 comprises an electric contact 4, which extends along a first longitudinal side of the standing wave cavity 3, substantially over the whole longitudinal extension of the standing wave cavity 3, and is split into a first electric contact section 5 and a second electric contact section 6 by a nonconducting split in the electric contact 4. Furthermore the laser assembly 1 comprises a grounded substrate 8, extending along a second longitudinal side of the standing wave cavity 3, substantially over the whole longitudinal extension of the standing wave cavity 3 and opposite of the first longitudinal side. Furthermore, the laser assembly 1 comprises a DC source 9 for pumping the laser 2, which is conductively connected to the first electric contact section 5 and to the second electric contact section 6, and an AC injection device 10, which is an RF oscillator and which is conductively connected to the first electric contact section 5. The first electric contact section 5 is adjacent to one end of the standing wave cavity 3. As such, the injected electrical AC signal is partially matched to the amplitude 7 of the electrical laser beat-note, since it has its maximum absolute value of the complex amplitude close to the end of the standing wave cavity 3, where the spatially dependent amplitude 7 shows a maximum, and is substantially zero everywhere else in the standing wave cavity 3.

The AC injection device 10 operates at a frequency, which is approximately the round-trip time of the beam in the standing wave cavity 3. As a result of injecting the electrical AC signal into the standing wave cavity 3, the longitudinal modes of the laser 2 are all equidistant resulting in the generation of a coherent frequency comb.

Figure 2:
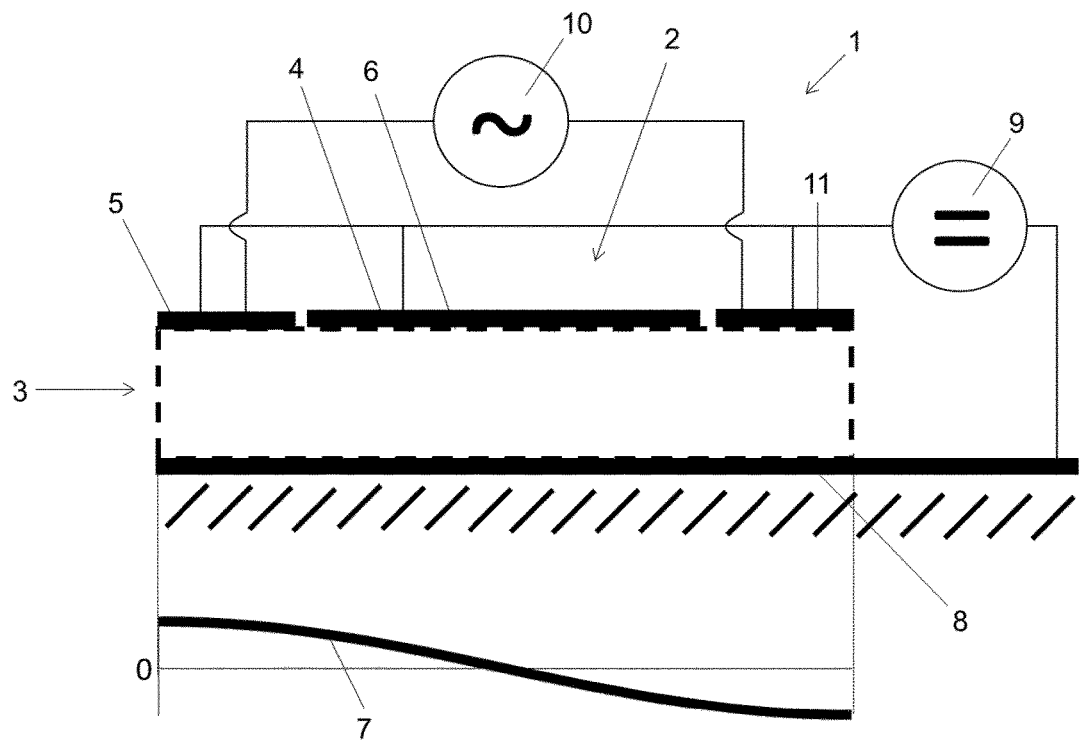
FIG. 2 a schematic diagram of an embodiment of the laser assembly with three electric contact sections.

FIG. 2 shows another embodiment of the laser assembly 1, which in difference to the embodiment of FIG. 1 comprises a first electric contact section 5, a second electric contact section 6 and one further electric contact section 11. Again, the electric contact 4 is split into the electric contact section 5, 6, 11 by substantially nonconducting splits in the electric contact 4. The DC source is conductively connected to all electric contact sections 5, 6, 11. One output of the AC injection device 10 is conductively connected with the first electric contact section 5 and its other, oppositely poled output, is conductively connected to the one further electric contact section 11. Thus the first and the one further electric contact section 5, 11, which are both adjacent to different ends of the standing wave cavity 3, are injected an electrical AC signal with the same absolute value of the complex amplitude, but with opposite (i.e. shifted by 180°) phases, whereas the absolute value of the complex amplitude at the second contact section 6 is substantially zero. Thus, the inject electrical AC signal is adjusted to the spatially dependent amplitude 7 of the electrical laser beat-note, which has a phase shift of 180° between both ends of the cavity. Again, the AC injection device 10 comprises an RF oscillator and is operated (and suitable for being operated) at a frequency in the proximity of the round-trip time in the standing wave cavity 3.

Figure 3:
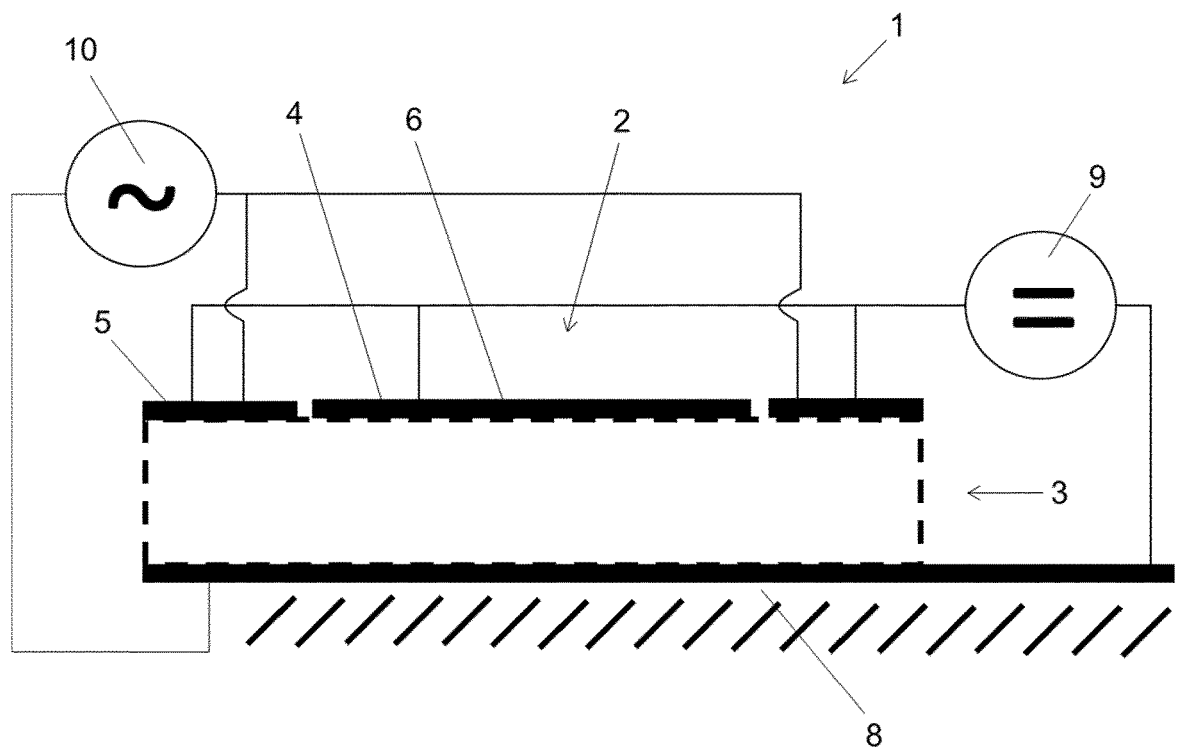
FIG. 3 a schematic diagram of another embodiment of the laser assembly with three electric contact sections, adopted for injection locking adjusted to the second harmonic of the amplitude of the electrical laser beat-note.

FIG. 3 shows another preferable embodiment of the laser assembly 1, which also comprises three electric contact sections 5, 6, 11. However the laser assembly 1 of this embodiment is adopted for injection locking of the second harmonic of the spatially dependent amplitude of the electrical laser beat-note in the standing wave cavity 3. As such, the AC injection device, which again is an RF oscillator, is conductively connected to the first electric contact section 5 adjacent to one end of the standing wave cavity 3 and to the one further electric contact section 11 adjacent to the other end of the standing wave cavity 3 (without any phase shift, i.e. in the phase). The AC injection device is not connected to the second electric contact section 6. As such, the first electric contact section 5 and the one further electric contact section 11 receive an electrical AC signal with the same absolute value of the complex amplitude and phase. Here, the AC injection device is operating close to the second harmonic of the standing wave cavity roundtrip frequency, i.e. at a frequency in a vicinity of twice the round-trip frequency. The spatial profile of the second harmonic is in such a way that the front and rear end of the standing wave cavity 3 can be modulated with the same amplitude and phase. There could also be a third modulated electric contact section in the middle of the cavity that is modulated with a phase shift of 180° with respect to both ends of the standing wave cavity 3.

Figure 4:
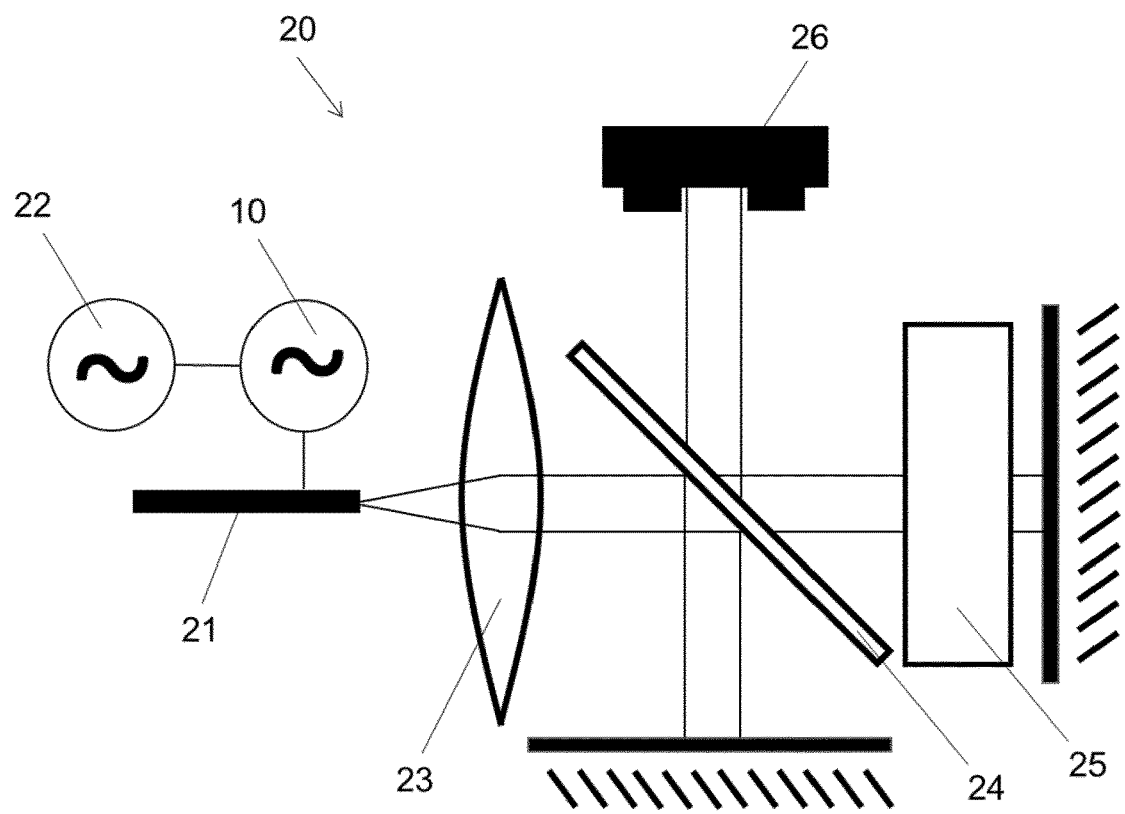
FIG. 4 an embodiment of a spectrometer for single-comb spectroscopy.

FIG. 4 shows an embodiment of a spectrometer 20 comprising a first laser assembly 21 with an AC injection device 10, e.g. one of the embodiments of the laser assembly 1 described above. The spectrometer furthermore comprises a modulation oscillator 22 for frequency modulating the AC injection device 10. The initial beam emitted from the first laser assembly 21 is collimated by a collimating lens 23 and then split into a first and a second beam by a beam splitter 24. The first beam is delayed by a temporally delaying element 25, which is a multipass cell and comprises an interaction zone for interacting the first beam with an analyte, and reflected back to the beam splitter by a mirror. The second beam is also reflected back to the beam splitter by a mirror. The first beam and the second beam are then combined by a beam combiner, which is the beam splitter 24 (e.g. a semitransparent mirror), onto a detector 26, which has a large enough bandwidth to detect multiheterodyne beating.

The beating and thus the repetition frequency in the standing wave cavity of the first laser assembly 21 is determined by the frequency of the RF oscillator used for injection locking. Thus, by modulating the frequency of the RF oscillator in time, e.g. by a rectangular signal, the distance between the teeth of the comb can be changed. The temporally delaying element 25 delays the first beam. Combining the delayed (first) and the undelayed (second) beam on a detector forms a heterodyne beating, because the delayed light has a slightly different intermodal difference frequency (i.e. the frequency interval between two comb teeth) as the non-delayed light. This multiheterodyne beating enables spectroscopic examination of the analyte. It is also possible that the multiheterodyne beating is detected in the laser assembly 21 itself.

Figure 5:
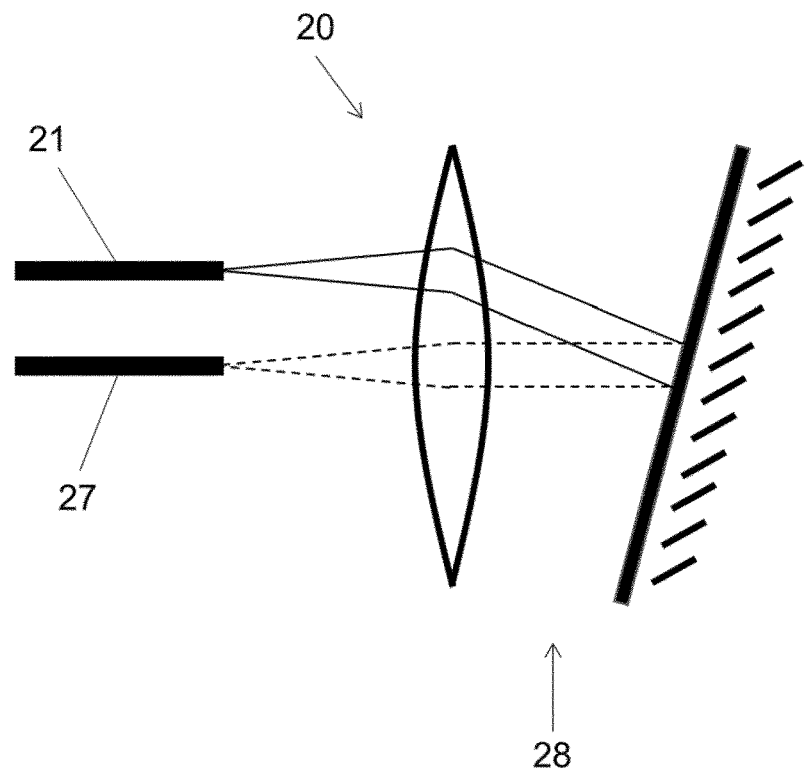
FIG. 5 an embodiment of the spectrometer for dual-comb spectroscopy.
Figure 6:
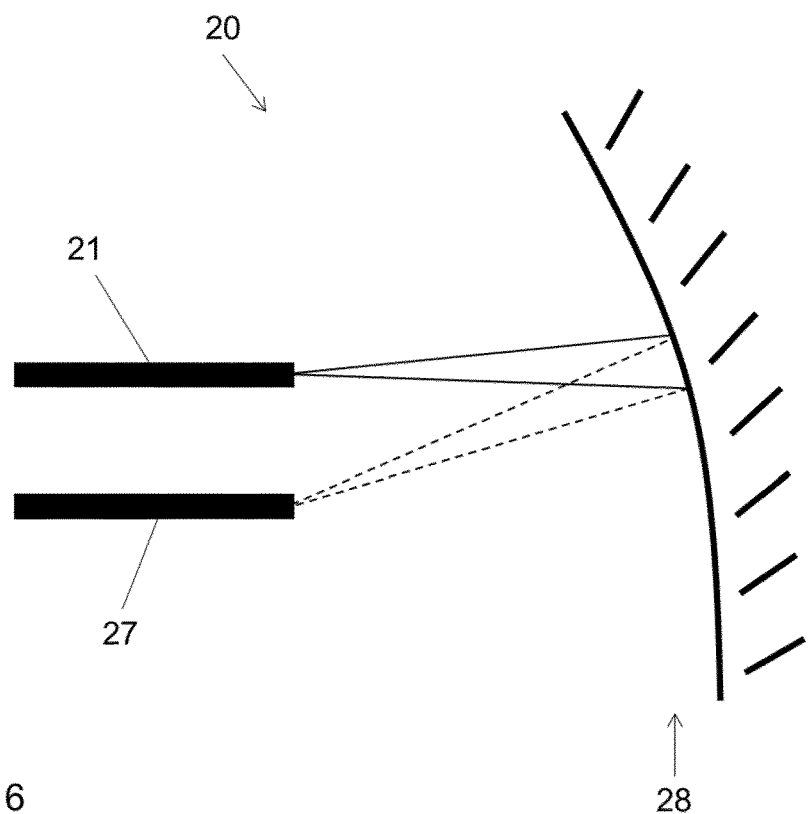
FIG. 6 another embodiment of the spectrometer for dual-comb spectroscopy.

FIG. 5 and FIG. 6 show two embodiment of the spectrometer 20 comprising a first laser assembly 21 and a second laser assembly 27, which differ in the configuration of the optical arrangement 28, which directs and focuses a first beam from an output of the first laser assembly 21 into an output of the second laser assembly 27 and a second beam from the output of the second laser assembly 27 into the output of the first laser assembly 21. The spectrometer. In the embodiment of FIG. 5, the optical arrangement 28 comprises a lens and a (tilted) flat mirror, whereas in the embodiment of FIG. 6, the optical arrangement 28 comprises a curved mirror. An RF spectrum analyzer (not shown) is connected to at least one electric contact section of the first laser assembly 21. The embodiments of FIG. 5 and FIG. 6 are particularly easy to be partially or completely implemented on a chip, e.g. using dielectric or plasmonic waveguides instead of free-space optics.

Figure 7:
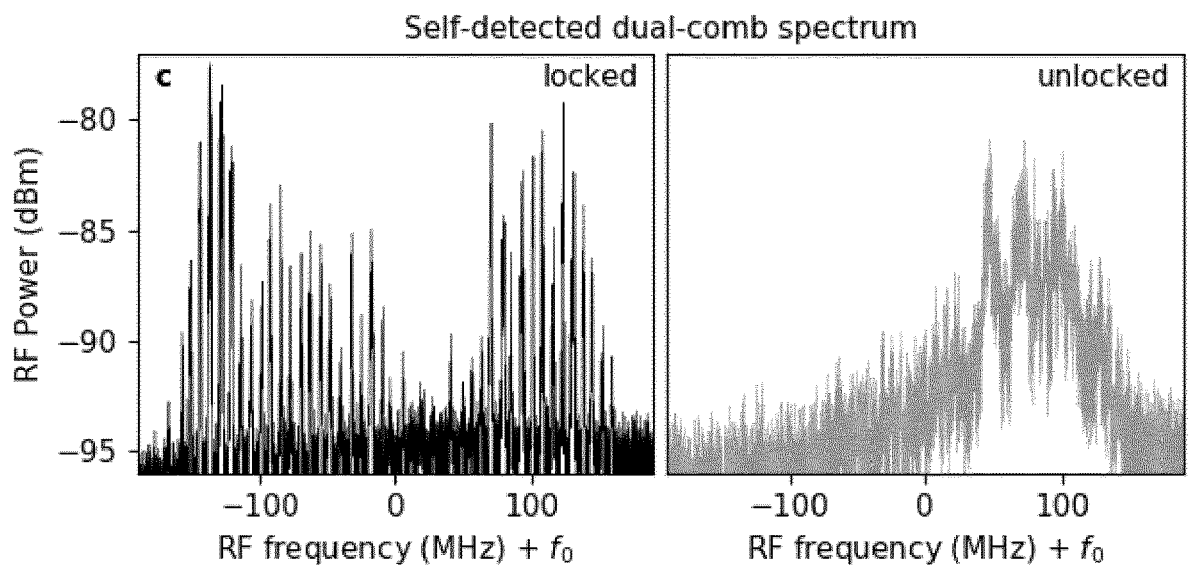
FIG. 7 a plot of a self-detected dual-comb spectrum with locked and unlocked lasers.

It is not necessary for an external detector to be provided for detecting the dual-comb beating of two frequency combs. Instead, as disclosed with this embodiment, it is possible to shine the light of one laser assembly providing a frequency comb into another laser assembly providing a frequency comb and extract the beating directly through one or more electric contact sections used for injecting the electrical AC signal into the standing wave cavity with an RF spectrum analyzer. The multiheterodyne beat consists of several narrow lines corresponding to pairs of lines of both frequency combs. However, if one laser should by unlocked by detuning the respective injection frequency, the well-defined lines vanish and only a broad peak without individual lines remains; such an unlocked multiheterodyne beat limits the applicability for spectroscopy purposes. This can be seen in FIG. 7, which shows two plots of a self-detected dual-comb spectrum, wherein the left subfigure shows the plot for both lasers being locked and the right subfigure shows the plot for one laser being unlocked. In FIG. 7, $f_0$ is the round-trip frequency, which here is approximately 9 GHz.

Figure 8:
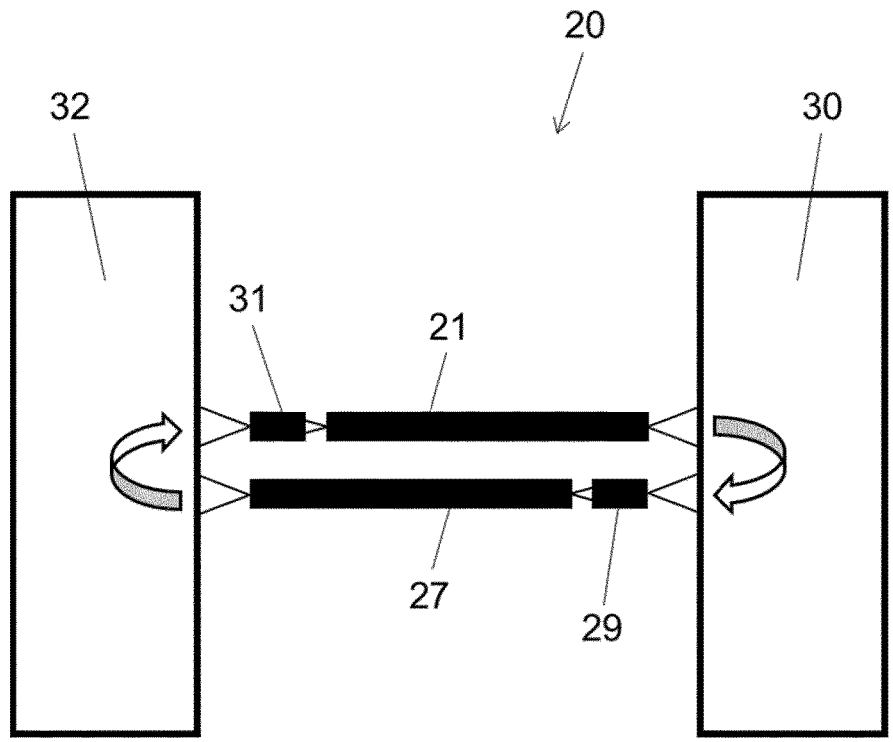
FIG. 8 an advantageous embodiment of the spectrometer for dual-comb spectroscopy.

FIG. 8 shows an advantageous embodiment of the spectrometer 20 comprising a first laser assembly 21 and a second laser assembly 27. A first beam from a first output of the first laser assembly 21 and a second beam from a first output of the second laser assembly 27 are directed into a first detector 29 by a first optical arrangement 30. The first optical arrangement 30 also comprises an interaction zone for interacting the first beam with an analyte. Furthermore, a third beam from a second output of the first laser assembly 21 and a forth beam from a second output of the second laser assembly 27 are directed into a second detector 31 by a second optical arrangement 32, which contains an interaction zone for interacting the fourth beam with a reference sample. (A reference sample is not necessarily required, there may also be for example no interaction at all for the forth beam.) The optical arrangement 30, 32 can for example be (on-chip) dielectric or plasmonic waveguides or contain free-space optical elements such as lenses, mirrors and beam-splitters.

Such a (dual-comb) spectrometer 20 consisting of two lasers assemblies 21, 27 according to any of the laser assemblies disclosed herein and at least one, preferably and in this embodiment two, detectors can easily be integrated on a chip and has the advantage that it is less sensitive against various environmental conditions, e.g. temperature fluctuations. Injection locking of the frequency combs, i.e. operating the laser as disclosed herein, mitigates the effect of strong optical feedback that is omnipresent in on-chip optics.

Preferably, the two laser assemblies 21, 27 are contained on the same chip as the two detectors 29, 31.

By shining always one laser beam from each laser assembly into a corresponding detector, one can measure the multiheterodyne beating of the light that did not interact with the analyte in the second detector 31 and the beating of the light that did interact with the analyte in the first detector 29. This enables the spectroscopic examination of the analyte by dual-comb techniques.

The detectors 29, 31 and/or the optical arrangements 30, 32 can be arranged such that the two beams entering each detector 29, 31 enter them from the same direction or from a different/opposite direction. If they are arranged such that the laser light from both laser assemblies 21, 27 enters the detectors 29, 31 from the same side, the stabilization against optical feedback via injection locking allows configurations, where a part of the light focused onto the respective detector 29, 31 is also fed into one or both laser of the laser assemblies 21, 27, e.g. if the laser assemblies 21, 27 and the detectors 29, 31 are spatially close.

Figure 9:
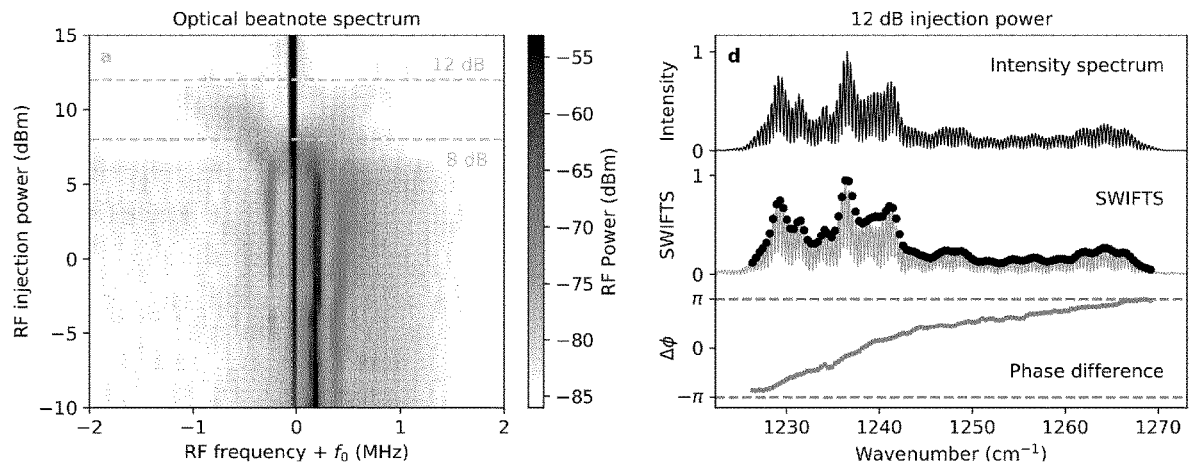
FIG. 9 plots of an optical beat-note spectrum as a function of the injected RF power and of an intensity spectrum, SWIFTS (a detailed SWIFTS characterization at 12 dBm) and the phase difference over the wavenumber.

FIG. 9 illustrates one possible benefit of the invention, namely that coherent injection locking of laser with a high phase-noise to an external AC source as disclosed herein produces a coherent frequency comb with very low phase noise. The left subfigure of FIG. 9 shows the microwave spectrum of the optical beat-note of a semiconductor laser frequency comb. The laser beat-note of the free-running frequency comb (not visible), i.e. without injection locking or any other stabilization measures, is broad. This is a consequence of relatively large amplitude and phase noise of the comb modes. As the injected RF power, i.e. the power of the AC injection device, is increased, the broad electrical laser beat-note of the (for this Fig.) QCL is pulled towards the injected beat-note. Finally, the QCL electrical laser beat-note is completely controlled by the injected signal and the broad noise-pedestal disappears. A characterization of the frequency comb in this state using "Shifted Wave Interference Fourier Transform Spectroscopy" (SWIFTS) is shown on the right subfigure of FIG. 9. If the intensity spectrum (plot on the top right) and the SWIFTS spectrum (plot on the center right) overlap on the whole span of the spectrum, this means that the frequency comb is fully coherent on the whole span of the spectrum, which is clearly visible. Furthermore, the characteristic phase profile (plot on the bottom left) ranging from 0 to 2*pi observed also in free-running frequency combs is preserved upon injection of an external AC, in particular RF, signal.

Figure 10:
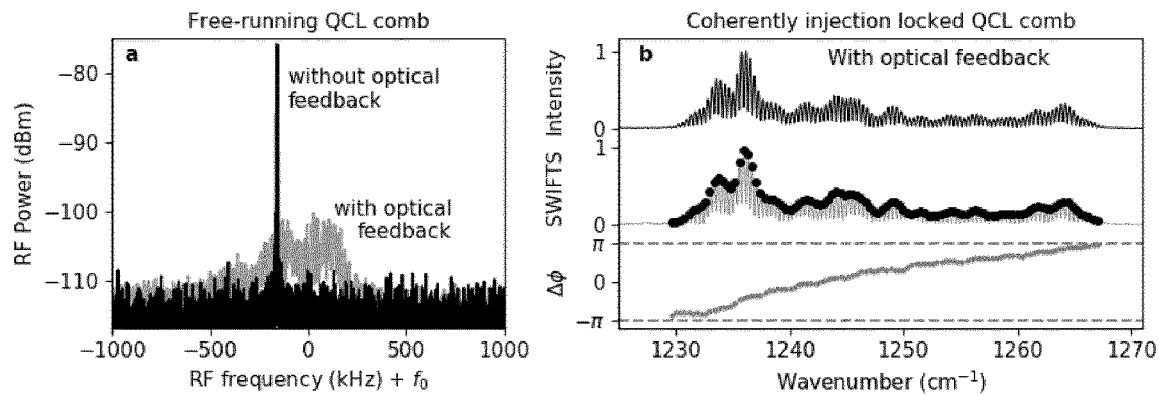
FIG. 10 plots of the electrical laser beat-note of a free-running QCL comb and the intensity, SWIFTS and phase difference for a coherently injection locked QCL comb.

FIG. 10 illustrates another benefit of the method of operating a laser and the laser assembly as disclosed herein, namely that appropriately injection locked QCL frequency combs are less sensitive against optical feedback. Usually, QCL frequency combs are very sensitive to optical feedback. This can be seen in the example of the electrical laser beat-note of a QCL frequency comb, in the left subfigure of FIG. 10. The curve with a peak was measured in a configuration, where optical feedback was minimized. It is very narrow and stable, indicating that all modes of the comb are equidistant with very little phase noise. The other curve was measured in a configuration, where a polished Si wafer reflected back a considerable portion of the light emitted by the laser. The electrical laser beat-note becomes significantly broader and weaker indicating the loss of coherence. The right subfigure of FIG. 10 shows plots for a laser operated as disclosed herein, i.e. an appropriately coherently injection locked QCL frequency comb. The SWIFTS characterization (plot on the center right) of the electrically injection locked laser in the same configuration as for the measurement of the unstable electrical laser beat-note demonstrates that injection locking is able to mitigate the fatal effect of feedback. Despite intense optical feedback, the laser remains coherent, which is proven by the SWIFTS spectrum. The characteristic phase profile ranging from 0 to 2*pi is preserved. The stabilization of semiconductor frequency combs against optical feedback is especially important in real-life applications, as optical feedback is omnipresent and limits the versatility and range of application of semiconductor laser frequency combs greatly.

Figure 11:
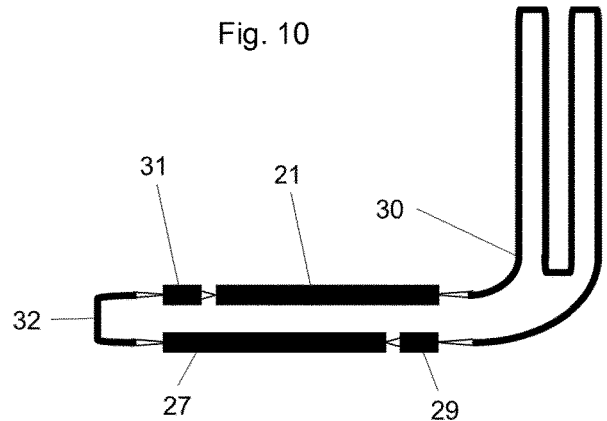
FIG. 11 another advantageous embodiment of the spectrometer for dual-comb spectroscopy.

FIG. 11 shows another advantageous embodiment of the spectrometer 20, similar to the embodiment shown in FIG. 8, comprising a first laser assembly 21 and a second laser assembly 27. The spectrometer 20 of this embodiment is particularly well for being implemented on a chip. Herein, the first optical arrangement 30 and the second optical arrangement 32 each comprise an optical waveguide integrated on the chip. Therein the optical waveguide of first optical arrangement 30 has an optical path length $L_1$ and the optical waveguide of the second optical arrangement 30 has an optical path length $L_2 \ll L_1$, such that laser beams being directed through the first optical arrangement 30 interact with an analyte in the vicinity of the spectrometer 20, whereas laser beams being directed through the second optical arrangement 32 do substantially not interact with the analyte in the vicinity of the spectrometer 20. As such, an analyte surrounding the chip, on which the spectrometer 20 is implemented, can be analyzed and the absorption spectrum be recorded.

The following examples A and B shall further explain the inventive idea, while not being limiting to the claims.

Example A

This example shall provide conclusive proof that all teeth of a QCL frequency comb can be locked coherently with an AC injection device, in particular an external RF source, by injecting an electrical AC signal adjusted to the electrical laser beat-note, in particular by applying an RF signal only to one end of the laser (standing wave) cavity. This is the section of the cavity, where the electrical beating is most susceptible to the injected signal due to its inherent spatio-temporal pattern.

Figure 12:
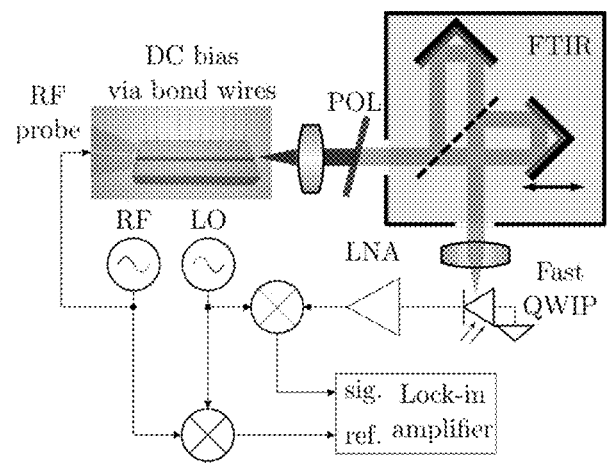
FIG. 12 a SWIFTS setup (wherein the optical beat-note of the QCL is detected by the QWIP through an FTIR, amplified by a low-noise amplifier (LNA) and mixed down to approximately 40 MHz using a local oscillator (LO); the mixing product of the LO and the oscillator used for injection locking (RF) acts as reference for the lock-in amplifier; a polarized (POL) is used for adjustable attenuation)

Proving frequency comb operation of a QCL is a challenging task because the fast gain recovery time prevents the formation of short and intense pulses. Consequently, traditional methods based on non-linear autocorrelation techniques cannot be employed. Instead, one can use a linear phase-sensitive autocorrelation method called 'Shifted Wave Interference Fourier Transform Spectroscopy' (SWIFTS, FIG. 12). SWIFTS enables the direct measurement of the coherence and phases of the emitted comb spectrum. The light emitted by the QCL is shined through a Fourier transform infrared (FTIR) spectrometer and detected by a fast photodetector. For this purpose, there was designed and fabricated an RF optimized quantum well infrared photodetector (QWIP) matched to the laser emission wavelength. By measuring the two quadratures X and Y of the optical beat-note as function of the mirror delay $\tau$ one obtains the complex interferogram of the portion of light that is locked to the RF oscillator. Contributions of mode pairs that are beating at another frequency are filtered by the lock-in. Subsequently, one can retrieve the SWIFTS spectrum by applying a fast Fourier transform to the complex interferogram. In order to discuss this in more detail, one can consider the electric field of the comb that is composed of discrete modes with amplitudes $A_n$ and frequencies $\omega_n = \omega_0 + n\omega_r$, where n is an integer and $\omega_0$ and $\omega_r$ are the carrier envelope offset frequency and repetition frequency of the comb. The complex SWIFTS spectrum is then given by (A.1:)

$$\mathcal{F}(X + iY)(\omega) = \sum_n |A_n||A_{n-1}|e^{i(\phi_n - \phi_{n-1})} \times \left[\delta\left(\omega - \omega_{n-\frac{1}{2}}\right) + \delta(\omega - \omega_r/2)\right].$$

The complex SWIFTS spectrum in eq. A.1 contains the phase difference of adjacent comb lines. Since only the part of the light locked to the phase reference is measured by the lock-in, the SWIFTS amplitudes are a direct and spectrally resolved measure of the intermodal coherence. If two modes are fully coherent (i.e., phase-locked), the SWIFTS amplitude is commensurate with the geometric average of the amplitudes $|A_n A_{n-1}|$ of the intensity spectrum. If, however, the relative phase-noise of a mode pair is non-zero, the SWIFTS amplitude decreases due to the narrow filter bandwidth of the lock-in.

Figure 13:
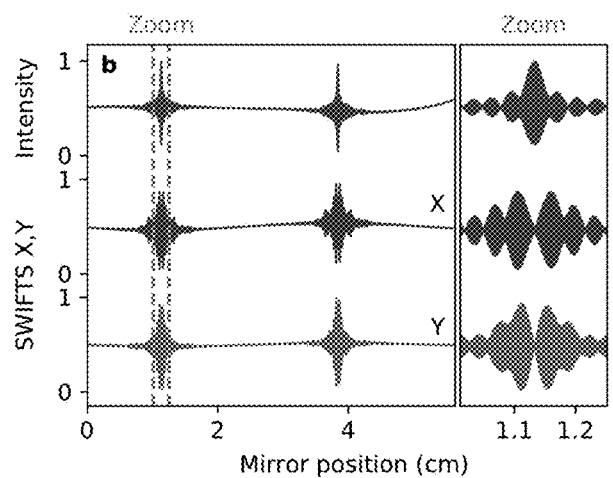
FIG. 13 intensity and SWIFTS quadrature interferograms of the free-running QCL frequency comb with zoom around zero path.

Before investigating coherently injection locked frequency combs, it is insightful to analyze the behavior the freerunning comb, i.e. without RF injection or any other stabilization method. For this purpose, the electrical beatnote is used as phase reference. A particularly interesting feature is already conspicuous in the recorded interferograms (see zoom in FIG. 13). Both SWIFTS quadratures have a minimum at zero-path difference of the FTIR mirrors, whereas the intensity interferogram has its maximum there. This phenomenon is related to the naturally favored comb state in QCLs, where the phases are arranged in a way that minimizes the amplitude of the optical beatnote and thus the amplitude modulation of the laser intensity. This is due to the short sub-ps upper state lifetime in QCL active regions. The corresponding SWIFTS spectrum (FIG. 14) has the same shape as the intensity spectrum without showing any spectral holes. This proves that indeed all teeth of the comb are phase-locked. The SWIFTS phases, i.e. the phase difference of adjacent comb lines, cover a range of $2\pi$ from the lowest to the highest frequency mode. This is consistent with the observation of a dominantly frequency modulated output of the QCL with a linearly chirped instantaneous frequency.

Figure 14:
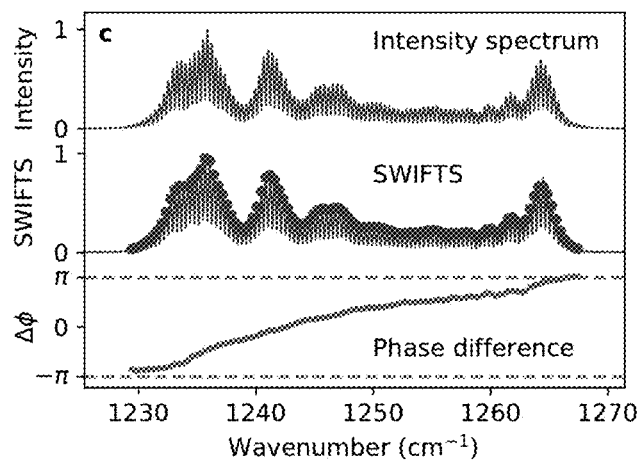
FIG. 14 an intensity spectrum (top), a SWIFTS spectrum (middle) with expected SWIFTS amplitudes for full coherence (dots), and the phase difference (bottom) between adjacent comb lines retrieved from the SWIFTS data.
Figures 15, 16:
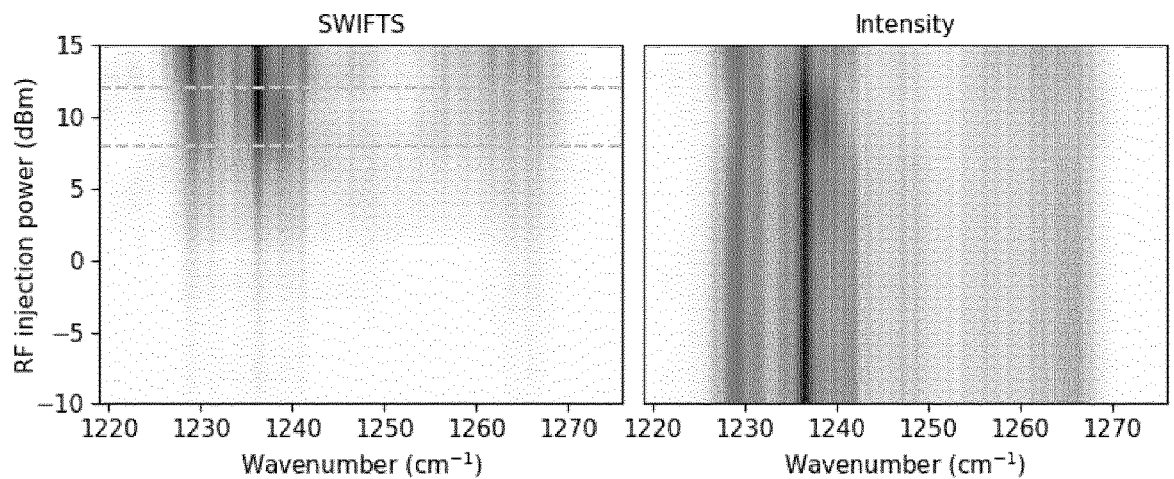
FIG. 15 SWIFTS spectra as a function of injected power.
FIG. 16 intensity spectra corresponding to FIG. 15.
Figures 17, 18:
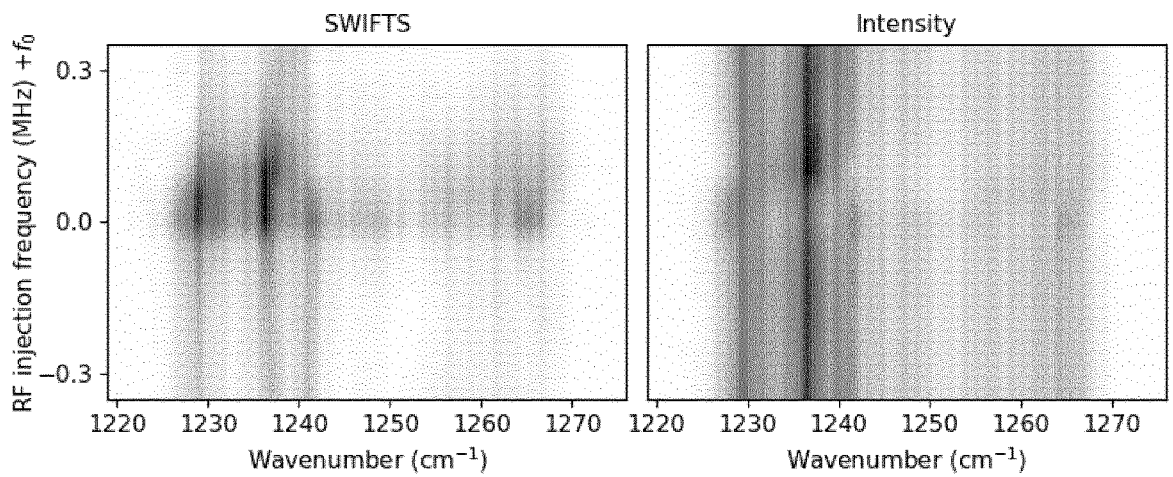
FIG. 17 SWIFTS spectra for different injection frequencies at 12 dBm injected power.
FIG. 18 intensity spectra corresponding to FIG. 17.

The first challenge to prove coherent injection locking is to show the capability to lock the QCL electrical laser beat-note to the external oscillator. To do so, we drive the QCL at a bias where it operates in the high-phase noise regime and shine it directly on the fast QWIP. We then record the RF spectrum of the QWIP current with a spectrum analyzer while keeping the injection frequency fixed and ≈100 kHz below the electrical laser beat-note (FIG. 9, left subfigure). As the injected RF power is increased, two sidebands appear above and below the frequency of the optical beatnote due to the mixing of the beatnote and the injected signal. The broad beatnote is pulled towards the frequency of the injected signal as the RF power is further increased to 5 dBm and finally locks at 8 dBm. Two sidepeaks that are roughly 20 dB weaker than the initial beatnote remain. At 12 dBm, also these sidepeaks vanish and the microwave spectrum of the optical beating is fully controlled by the injected signal. The noise floor around the locked narrow beatnote is roughly 30 dB weaker than the peak power of the originally broad beatnote. This proves that the vast majority of the optical beatnote power is locked. In order to highlight spectral regions which are locked to the external oscillator, we measure the SWIFTS and intensity spectrum as function of the injected power (FIGS. 15 and 15). The SWIFTS amplitude starts to grow considerably at 5 dBm—equal to the power level at which the broad beatnote in FIG. 9 (left subfigure) is pulled towards the injection frequency. In the region between 8 and 12 dBm, especially the SWIFTS amplitude of the comb lines around 1230 cm-1 and 1265 cm-1 increases suggesting that these modes are responsible for the weak sidepeaks of the optical beatnote in FIG. 9 (left subfigure). A detailed snapshot of the SWIFTS characterization at 12 dBm RF power (FIG. 9, right subfigure) shows that the SWIFTS amplitudes are commensurate with the values expected from the intensity spectrum. This proves that the entire spectrum of the QCL is phase locked to the RF oscillator. The SWIFTS phases feature the same phase pattern as observed in free-running comb operation, covering a range of $2\pi$ (FIG. 14). It is remarkable that the frequencies of the intermode beatings are locked to the external modulation while their phases remain in the natural state of a free-running QCL frequency comb instead of synchronizing to the injected signal. In order to investigate the influence of the injection frequency on the coherence of the QCL, one can sweep it across the broad beatnote. The SWIFTS spectra (FIG. 17) show that the QCL is coherently locked to the injected signal in a narrow range of approximately 100 kHz around the frequency of the beatnote. Outside of this locking range, only a few strong modes contribute to the SWIFTS spectrum. The narrow locking range could explain why previous studies concluded that injection locking leads to a loss of intermodal coherence. The electrical injection has an influence on the intensity spectrum only in the locking range (FIG. 18).

In real-life applications, QCL frequency combs have to withstand harsh conditions while maintaining coherence. Among these conditions is optical feedback. We illustrate the fatal effect of optical feedback on a free-running QCL frequency comb by replacing the attenuating polarizer (POL in FIG. 12) by a polished silicon wafer perpendicular to the QCL beam. In this configuration, the QCL is subject to both intense static feedback from the Si wafer as well as temporally varying feedback from the QWIP facet due to the scanning FTIR mirrors. While the electrical beatnote is narrow and stable if the beam is attenuated by the polarizer (FIG. 10, left subfigure), it becomes significantly broader and weaker upon exposure to strong optical feedback indicating the loss of coherence. This fatal effect of optical feedback is omnipresent in dual-comb spectrometers based on QCL combs. Expensive and bulky optical isolators have to be employed to ensure stable comb operation, impairing the capabilities of miniaturization. In contrast, both the coherence and the phase characteristics of an injection locked comb are preserved even in presence of strong optical feedback (FIG. 7). A prototype self-detected dual-comb setup highlights the enormous potential of coherent electrical injection locking for miniaturization. The light of two QCLs located on the same chip is shined directly into each other without any optically isolating elements in between (corresponding to FIG. 7). When both lasers are locked, the self-detected dual-comb beat spectrum consists of numerous equidistant lines with a spacing of $\Delta f_{rep}$=7.4 MHz. If the injection frequency of one laser is detuned by 200 kHz—thus leaving the locking range (FIG. 17)—the multiheterodyne signal becomes broad and no dual-comb lines are visible anymore. These results open up new avenues towards all-solid-state MIR spectrometers, where stabilization of the combs and the ability to cope with intense feedback are vital.

These investigations demonstrate that electrical injection locking of MIR QCLs is a versatile technique that enables the generation of coherent frequency combs if the inherent spatio-temporal pattern of the electrical beatnote is taken into account. The fact that the repetition frequency is fixed by the injected signal can be utilized to stabilize the carrier envelope offset frequency against a narrow molecular absorption line via the driving current. The possibility of all-electric stabilization using low-budget electronics, as those found in every mobile phone, will lead to a new class of miniaturized dual-comb spectrometers.

Device: The investigated QCL is uncoated and operating at 8 μm The laser has a relatively low group delay dispersion. The laser is mounted epi-side-up on a copper submount. The temperature of the submount is kept at 15° for all measurements presented using a Peltier element and PTC5000 temperature controller. A HP 8341B synthesized sweeper is used for injection locking. The RF signal is injected close to the front end of the QCL cavity through 40 GHz two-terminal RF probes. It has to be noted that due to the large parasitic capacitance, the RF signal is strongly damped 30-40 dB. In case of an RF optimized device, split contacts are possible to prevent the simultaneous excitation of both ends with the same phase.

SWIFTS: The QWIP used to detect the optical beatnote is fabricated in square mesa geometry with 100 μm side length. The mesa is connected to a coplanar transmission line with a short wirebond resulting in a cutoff frequency slightly below 10 GHz. The optical beatnote detected by the QWIP is amplified and mixed down to below 50 MHz. A Zurich Instruments HF2LI lock-in amplifier and the Helium-Neon trigger of the FTIR were used to record the SWIFTS interferograms. The complex sum of both quadrature interferograms can be written as (A.2:)

$$(X+iY)(\tau) = \sum_n A_n A_{n-1}^* \left[\cos\left(\frac{\omega_r \tau}{2}\right) + \cos\left(\omega_{n-\frac{1}{2}}\tau\right)\right].$$

Eq. A.2 differs slightly from previously published work because the FTIR used here (Bruker Vertex 70v) moves both interferometer arms by ±τ/2 instead of just one arm by τ.

Self-detected dual-comb spectrum: The two QCLs on the dualcomb chip are roughly 1 mm apart from each other. The light emitted from the front facets of the dual-comb chip is collimated using an anti-reflection coated ZnSe lens with 1.5 inch focal length. By aligning a mirror in front of the lens, the light of one laser is reflected into the other. The dual-comb beat around 8.7 GHz is extracted directly from the laser using a RF probe and recorded with a spectrum analyzer (acquisition time≈0.2 s).

Example B

This example shall demonstrate a robust all-electrical technique to generate optical frequency combs in the mid-infrared using ICL. It is shown that ICLs naturally favor FM-type comb operation, the same as has been observed in QCL frequency combs, suggesting that the previous believe that interband cascade lasers possess slow enough gain dynamics that can potentially allow passive mode locking has to be questioned. The facts that ICLs with its large interband lifetime naturally favors repulsive synchronization contradicts simple explanations based on the lifetime of the laser transitions and suggests that other relevant mechanisms have been previously overseen. We also demonstrate that by electric injection locking it is possible to enforce the naturally unfavored in-phase synchronization state. In this actively mode locked regime, the device generates short pulse trains with picosecond pulse widths and serves as a first proof that multiple normal modes can be excited by external modulation.

Frequency Comb Operation of ICLs:

To investigate optical frequency comb formation in interband cascade lasers is again utilized a technique, referred to as shifted wave intermode beat Fourier transform spectroscopy (SWIFTS). This technique is based on the spectrally resolved measurement of the fundamental intermode beatings using a fast photodetector and a Fourier transform interferometer (FTIR). A more detailed description can be found below. Key is, that SWIFTS enables one to measure both the amplitude and phase of the fundamental intermode beatings, i.e. the relative phase between adjacent comb lines. The phases of the comb lines can then be calculated by the cumulative sum, which together with the amplitudes obtained from the intensity spectrum, allows the direct reconstruction of the time domain signal of comb states. Here are plotted the phases of the intermode beatings rather than their cumulative sum to emphasize the characteristic intermode beat phase patterns that arise from phase locking via repulsive or attractive coupling.

Figure 19:
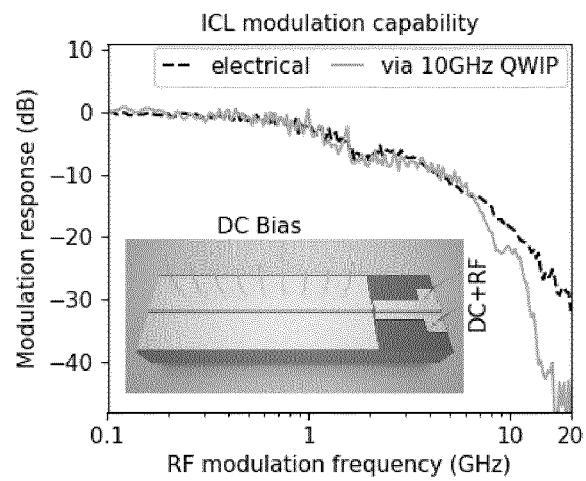
FIG. 19 the high frequency modulation capabilities and a sketch of a device for repulsive frequency comb operation by coherent injection locking.
Figure 20:
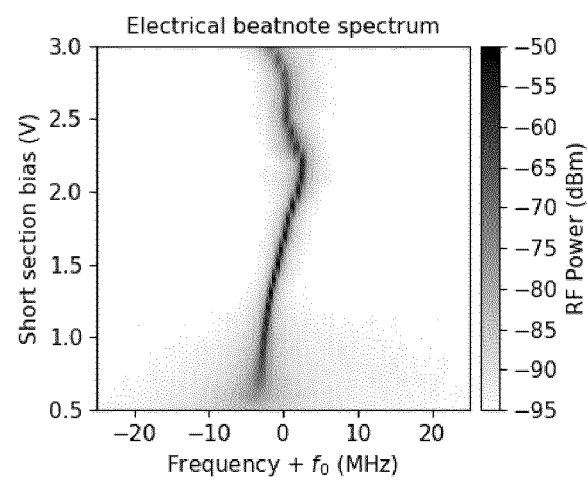
FIG. 20 the electrical laser beat-note tuning with the short section bias to obtain a narrow electrical laser beat-note.
Figure 21:
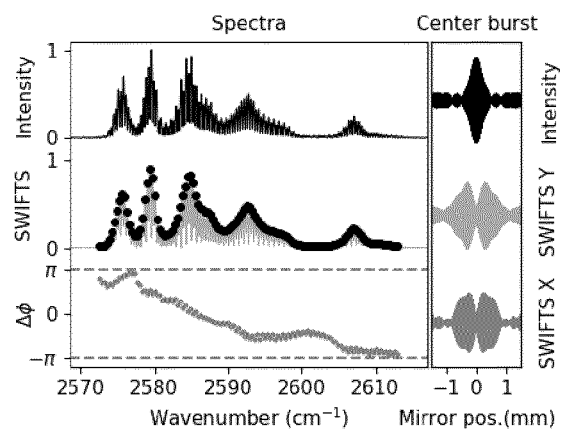
FIG. 21 intensity and SWIFTS spectra, as well as the center burst of the corresponding interferograms (wherein the phases clearly show a phase balance state due to repulsive synchronization; the SWIFTS center burst shows the characteristic minimum at zero path difference)

FIG. 19 shows a sketch of the device with two sections. To optimize both thermal and RF modulation properties, a long section with a thin passivation layer is kept at a constant bias and a shorter section with a thick passivation layer to reduce the parasitic capacity allows efficient RF modulation. Furthermore, as discussed in more detailed in the methods section, it is key to apply the modulation only to a part of the laser, similarly as it is done for active mode locking. A first condition of optical frequency operation is the observation of a narrow beat note. A narrow beatnote arises when at least a part of the intermode beatings are synchronized (or if two modes dominate the spectrum). To study the synchronization capabilities in freerunning (without external modulation) it was specifically looked for bias conditions that show a relatively narrow beatnote. The waterfall plot showing the beatnote while sweeping the bias around the region of interest is shown in FIG. 20. The spectral width of the beatnote is similar to beatnotes observed in QCL in the so called high phase noise regime. In order to achieve full synchronization with low phase noise, there was applied a weak RF modulation matched to the observed beatnote frequency (round-trip frequency). It can be found that when perfectly matched to the natural beatnote frequency, a modulation as low as −30 dBm is sufficient, in order to obtain the intermode phases with SWIFTS. The amount of coherence and the intermode phase pattern are shown in FIG. 21 together with a zoom of the recorded interferograms at zero path difference. The SWIFTS amplitudes, which are a measure of the intermodal coherence, clearly show that frequency comb operation is obtained over the entire emission spectrum. Other than one might expect form an interband laser, the obtained comb state is not a mode-locked state with a short pulse train. Here, one can observe a very distinct intermode phase pattern that covers the entire phase space from 0 to −2π. The particular phase distribution corresponds to a dominantly frequency modulated (FM) waveform and is similar to what has very recently been observed in mid-infrared QCL frequency combs.

ICLs as Fast Gain Medium

The fact that ICLs behave more similar to QCLs in terms of their non-linear temporal dynamics as one might have expected, suggests that the life time of the laser transition is not the main parameter that determines the gain dynamics. Here, we emphasize that it is the way how carriers are injected into the laser levels that governs the fast temporal dynamics in ICLs.

Figure 22:
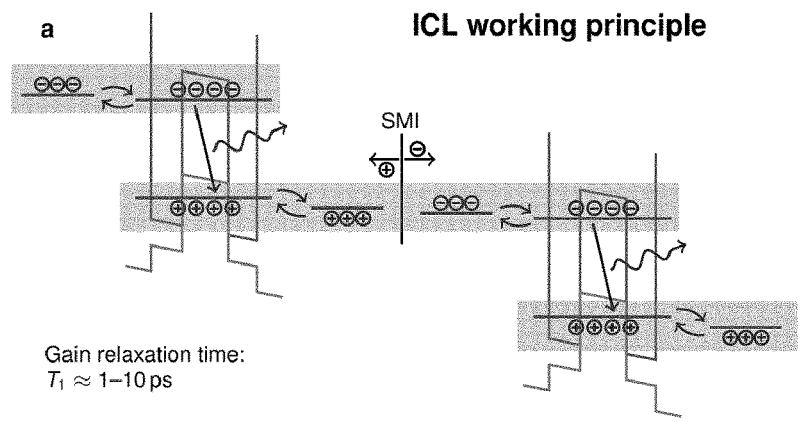
FIG. 22 the working principle of an ICL active region (wherein fast intersubband balancing between injectors and the laser levels reduce the gain response time to picosecond time scales)

In rate equation models, as those that can be found in textbooks and scientific papers, it is commonly assumed that the laser levels are filled via a constant pump rate. This is a quite good approximation for many kinds of lasers, such as optically pumped lasers, as well as diode lasers. However, as it should be argued, it entirely neglects a major mechanism in case of ICLs and QCLs. In ICLs and QCLs carriers are injected via fast intersubband scattering processes from the so called injector region. There, the pump rate corresponds to the net rate, which results from fast back and fourth scattering processes that happen at picosecond timescales. Assuming a constant pump rate, as it is commonly done also for this type of lasers, is thus a rather weak approximation, which completely neglects fast carrier balancing in lasers with intersubband injectors. While in QCLs it might have a minor impact, as also the laser transition is fast, in ICLs it completely changes the expected behavior. FIG. 22 sketches the working principle of an ICL. Electron-hole pairs are generated at the so called semi-metallic interface (SMI), which is realized by coupling hole and electron type subbands at a type-II broken gap semiconductor interface. Due to the internal carrier generation no doping is required, although it has been shown that high n-doping in the electron injector can significantly improve the performance of ICLs 23. The generated electrons and holes are injected into the upper and lower laser levels via fast intersubband scattering. We want to emphasize here again, that the fast intersubband scattering occurs in both directions, which leads to a fast balancing process between the injectors and the corresponding laser levels. The fast intersubband balancing regions are highlighted in FIG. 22 with grey rectangles.

Figure 23:
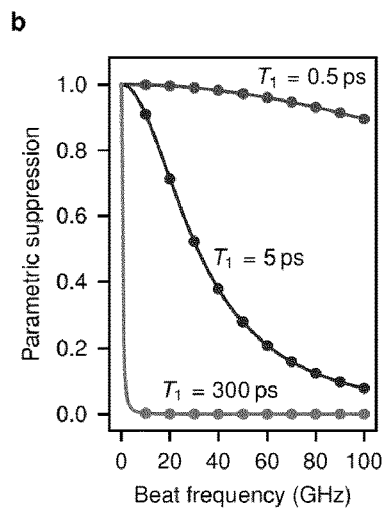
FIG. 23 that fast gain dynamics lead to parametric suppression via population pulsations (the faster the gain response, the more harmonics are repulsively coupled)

The interplay of fast injector balancing has three main implications. First, the gain dynamics become fast enough to enable strong four-wave mixing via population pulsations at several harmonics of the round trip frequency (see FIG. 23). Second, population pulsations will lead to a charge oscillations between the injectors and the laser levels, which are in-phase in all periods. The resulting displacement current makes it possible to observe a strong beatnote at the laser contacts and enables its synchronization to an external modulation. Third, the fast population response occurs via scattering to the injector and not via scattering between the laser levels. Thus, a large amount of energy can be stored within one round-trip. This is in contrast to QCLs, where the short non-radiative lifetime of the laser transition limits the capability to store energy over one round-trip. This is a main argument why QCLs cannot emit ultra short pulses with peak intensities higher than their continuous continuous wave value.

Repulsive Intermode Beat Synchronization

The main coupling mechanism responsible for frequency comb formation in fast gain media is four-wave mixing due to population pulsations, which leads to a phase sensitive coherent loss mechanism. Because of its similarity to oscillator arrays with repulsive global mean-field coupling, it should be related to repulsive mean-field coupling with the population pulsation being the mean-field. An intuitive example, that explains why population pulsation in fast gain media result in repulsive coupling, is a three mode situation with a dominant center and two weak side modes. As derived in Mansuripur et al., "Single-mode instability in standing-wave lasers: The quantum cascade laser as a self-pumped parametric oscillator." in Phys. Rev. A 94 (2016), the population pulsation at the difference frequency between the center mode its weak side modes will result in a parametric gain contribution with a negative sign, thus referred to as parametric suppression. The total gain of each sideband consists of the Lorentzian shaped gain of the two-level system, incoherent gain due to spatial hole burning, plus a negative parametric contribution due to population pulsation. In the case that the intermode beatings show opposite sign, thus often referred to as FM type, the two contributions balance each other and the population pulsation remains zero. This state sees more gain and is thus favored among the in-phase (amplitude modulate, AM) state. In case of fundamental frequency comb operation the spectrum can consist of hundreds of modes and such simple conclusions are difficult to be drawn. Each pair of laser lines results in a beating at its difference frequency. Not yet being phase locked, each pair beats at slightly different frequency due to the cavity dispersion, i.e. each pair sees a different round-trip frequency. Now, we imaging that all pairs are represented by oscillators that are globally coupled trough the population pulsation. If the dispersion is low enough and the coupling is sufficiently large, the oscillators can synchronize. As the coupling is of repulsive type the phases will be chosen in a very particular manner, such that the mean-field (population pulsation) is minimized. States that minimize the mean-field oscillation are commonly referred to as phase balance states and have been studied in many different fields, ranging from splay states in Josephson junctions to cluster states in complex networks. The more oscillators are coupled, the more balance states can exist. It is the stability that determines if a state can be observed. It was shown that more complex couplings, e.g. higher harmonic couplings can reduce the number of favored balances states. Harmonic FM waveforms as those described by Bessel functions were initially believed to be the naturally favored comb state in QCLs, however, they are only one out of many possible phase balance states and have not been observed in experiments. In ICL frequency combs, we observe a very particular balance state, where the intermode phases follow a nearly monotonic behavior over the emission spectrum covering the entire unit circle, similarly to what has been recently observed in QCL frequency combs. This indicates that a very complex coupling mechanism is present that favors exactly this state among others. We attribute this partly to higher harmonic population pulsations. In fast gain media four-wave mixing via population pulsations is also possible between pairs of next neighbors, next next neighbor, etc.

(see FIG. 23) The laser will favor a state, where all harmonics of the population pulsation are minimized.

Figure 24:
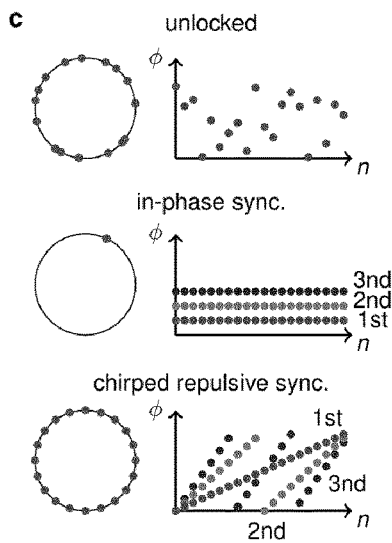
FIG. 24 a sketch of the three main states observed in Example B below, the unlocked and the in-phase state, as well as the repulsively synchronized phase balance state.
Figure 25:
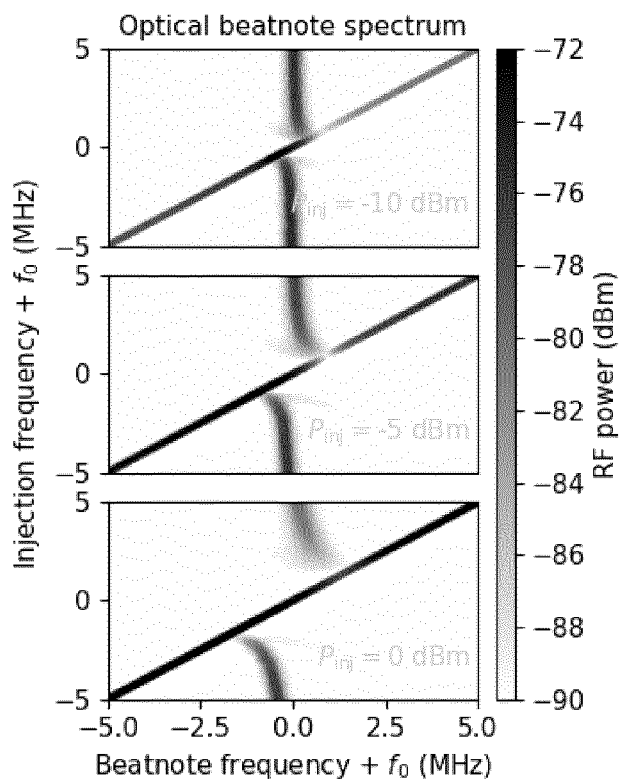
FIG. 25 injection locking range for three different injection powers (wherein the higher the power, the larger the locking range; the minimum might correspond to external enforced amplitude death)
Figure 26:
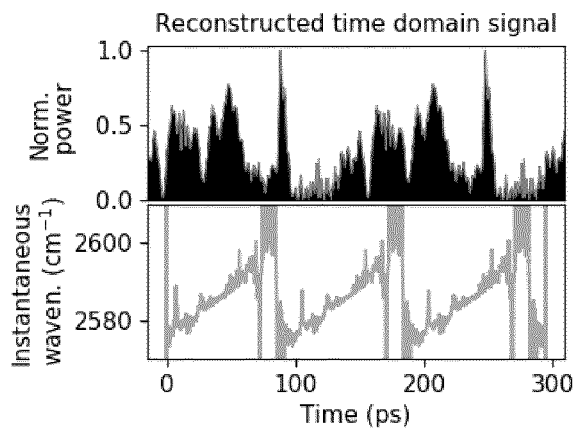
FIG. 26 intensity and SWIFTS spectral maps at 5 dB injection power show that intermodal coherence is achieved within a range of approx. 800 kHz.
Figure 27:
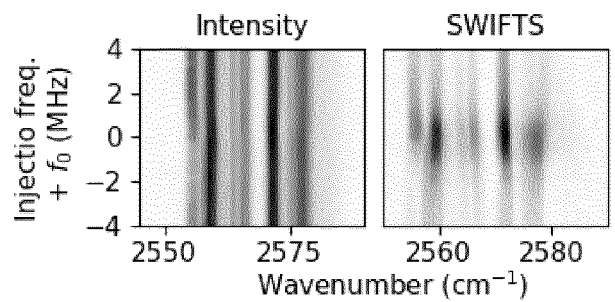
FIG. 27 the reconstructed time domain signal and instantaneous wavenumber of the repulsive synchronization state (where the data corresponds to SWIFTS data in FIG. 21)

FIG. 24 illustrates the unlocked state, in-phase synchronization, that would lead to periodic short pulse emission, and the particular repulsive synchronization pattern observed in ICL and QCL frequency combs. As shown in the figure, balancing is also achieved for higher harmonic intermode beatings, where the phase pattern for the nth harmonic approximately follows a phase distribution from 0 to $2\pi*n$. It should be believed that also the remaining group velocity dispersion (GVD) has an impact on the phase pattern. From this and recent measurements in QCLs, one can identify the tendency that a smaller remaining GVD leads to a more linear phase pattern, while a larger non-constant GVD leads to more complex patterns. Because of the remaining GVD in our device, external stabilization via injection locking is required. FIG. 25 shows the optical beatnote while sweeping the injection frequency for three different weak injection power levels, showing the expected scaling of the locking range with power. The intensity and SWIFTS spectral maps shown in FIG. 26 proof, that intermodal coherence and thus comb operation is achieved over the entire spectral range. As pointed out before, SWIFTS allows the reconstruction of the time domain signal, which is shown in FIG. 27. The instantaneous frequency shows a saw-tooth shape, sweeping over the spectral range within one round-trip. This behavior exactly matches, what has been recently observed in QCLs.

Repulsive Synchronization and AM Waveforms

In this section the impact of strong external forcing on repulsively synchronized comb states will be discussed. To discuss the impact of electrical injection locking in ICLs, it is important to emphasize the distinct delinking of the repulsive coupling of the intermode beat oscillators at each harmonic to their mean-fields and the attractive coupling of the mean-fields to the injected signal. Putting it differently, while it is plausible that the mean-field can be directly in-phase synchronized to injected modulation (via the coupling of the population inversion and the displacement current), it is even more intrigue that the individual intermode beat oscillators can still "freely" choose their phase to minimize the mean-field loss. Applying a small but large enough injection signal, the mean-field will try to synchronize to minimize loss, but the amplitude will remain unchanged. In this regime, the inherent phase characteristics of the repulsively phase locked frequency comb are preserved.

Figure 28:
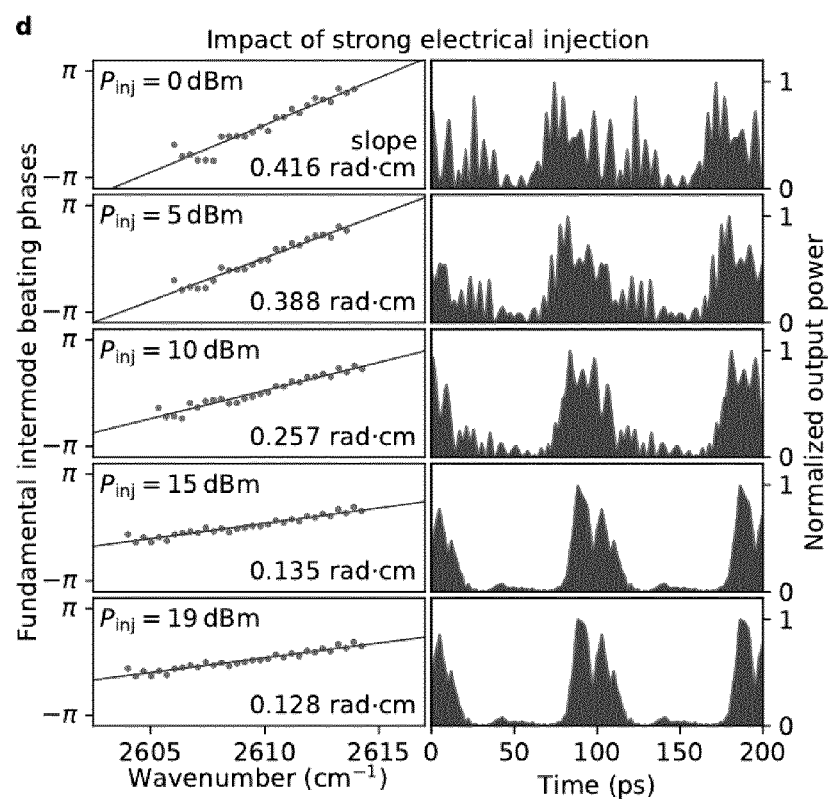
FIG. 28 the impact of strong injection on the repulsive phase pattern and time domain signal under smaller laser bias (wherein the higher the injected power, the stronger the amplitude modulation, but the repulsive coupling remains to splay the phases).

At this point, exciting implications can be drawn. Applying a larger injection signal, larger than that of the mean-field, the mean-field tries to follow the injected signal to minimize loss. This leads to a continuous transition of the phases pattern of more and more AM type characteristic, while the coupling mechanism remains of repulsive type. This is exactly what we observe in the experiments, as shown in FIG. 28. To highlight this behavior, we operate the ICL closer to threshold to increase the ratio between the strong injection signal to the small natural beating. There, the output signal already shows a quite significant amplitude modulation under weak injection. With increasing injection power, the slope of the phase pattern decreases and a more and more AM type modulation can be observed in the reconstructed time domain signal. Here, we want to emphasize that although the signal is dominantly amplitude modulated, its phase pattern remains determined by repulsive synchronization. This means, that the internal coupling tries to splay the phases and that the narrowing is only due to the strong externally enforced modulation of the mean-field. As a result, the time domain signal does not show short pulse formation, but its envelop tries follows the external modulation.

CONCLUSION

It was demonstrated that against common believe, ICLs are fast gain media and share more properties with QCLs than previously expected. In ICL and QCLs carriers are injected via fast intersubband transitions from an injector region, which makes them fundamentally different to other types of lasers. We then argue that the impact of population pulsations on the carrier injection rate cannot be neglected in this type of lasers and that fast carrier balancing between the laser levels and the injector is responsible for the fast gain dynamics in ICLs. By weak external synchronization, we are able to obtain robust frequency comb operation in ICLs for the first time with a sufficient proof. A very particular phase pattern has been observed, which is similar to that recently found in QCL frequency combs. This shows that ICLs are indeed fast gain media that favor a coherent balance state, where the intermode beatings at several harmonics are repulsively synchronized to minimize population pulsations. From this finding one has to question the previous believe that passive mode locking can be realized with this type of laser. We show that under strong electrical injection the laser remains in a repulsive synchronization state with a more and more amplitude modulated waveform. However, the repulsive coupling still spays the phases, resulting in very broad pulses.

Methods

Device fabrication: The laser ridges were fabricated with standard mask photolithography, reactive ion etching to device the laser waveguides, silicon nitride for the passivation layers and sputtered TiAu for the contact pads. The substrate was thinned to 160 μm and TiAu was sputtered on the backside and the devices were mounted epi-side up using indium on a copper mount. Different thickness of the passivation layer have been used to optimize the device performance in terms of output power and modulation capability.

Measurement setup: The devices were mounted on a copper submount, thermo-electrically stabilized to 15C. In order to improve the noise properties of our laser driver, we used home-build filters. The accuracy of temperature stabilization and the noise of the laser drivers play a crucial role for the performed measurements.

Relevance of the spatial beatnote profile: A very important aspect has to be considered when synchronizing the mean-field (population pulsation) to an external modulation. Recently, it has been found that the electrical beatnote at the round-trip frequency and its harmonics follow characteristic spatial patterns in standing wave lasers. Because of the boundary condition of the modes in the cavity, any beating between adjacent lines will follow a half wave cosine function along the cavity. Thus, at the round-trip frequency both ends beat with anti-phase and there is a minimum in the center. The same but with different spatial profile holds for all harmonics. As all intermode beatings of the same harmonic follow the same spatial pattern, it can be assumed to be irrelevant for repulsive synchronization. However, for external synchronization via electrical injection locking it is crucial to consider the anti-phase oscillation of both ends of the laser at the round-trip time. To achieve a significant spatial overlap with this inherent profile, we only modulate one end of the laser with a specifically RF optimized geometry (see FIG. 19).

SWIFTS: The SWIFTS concept was realized using a fast QWIP placed at the output window of a FTIR. The emitted light of the ICL is shined through the FTIR onto the QWIP. A local oscillator mixes down the QWIP signal to ≈40 MHz. The quadrature components X and Y of the QWIP signal in dependence of the delay time τ gives us two correlating interferograms for the RF locked part of each quadrature component and were measured using a lock-in amplifier. The reference signal is obtained by mixing of a local oscillator with the RF source. All interferograms were recorder by the locki-in using the trigger from the FTIR. Note, that our used FTIR moves each arm by ±τ/2. The complex sum of the interferograms is therefore given by (Eq. B.1:)

$$(X+iY)(\tau) = \sum_n A_n A_{n-1}^* \left[ \cos\left(\frac{\omega_r \tau}{2}\right) + \cos\left(\omega_{n-\frac{1}{2}} \tau\right) \right].$$

By applying the fast fourier transformation using zero-padding, peak fitting, both amplitude and phase of all intermode beatings can be directly obtained. The intermode beatings describes the coherence and phases between adjacent comb modes. The phases of the modes can be calculated by the cumulative sum of the intermode beating phases, which together with the intensity spectrum allows the reconstruction of the time domain signal of a comb state.

The invention claimed is:

1. A method of operating a semiconductor laser with a standing wave cavity and a fast gain medium, wherein a gain relaxation time of the gain medium is smaller than the round-trip time in the standing wave cavity, comprising:
   generating standing optical waves in the standing wave cavity of the laser, wherein an electrical laser beat-note with a spatially dependent amplitude is generated;
   pumping the laser with a DC current from a DC source coupled to the standing wave cavity;
   injecting an electrical AC signal into the standing wave cavity with an AC injection device to stabilize an optical frequency comb such that a spatial pattern of the injected electrical AC signal corresponds to the spatially dependent amplitude of the electrical laser beat-note along a longitudinal extension of the standing wave cavity, wherein the injected electrical AC signal is within a range and/or within an integer multiple of the range, wherein the range is within ±1% of a natural round-trip frequency in the standing wave cavity;
   wherein injecting the electrical AC signal corresponding to the amplitude of the electrical laser beat-note comprises coupling the AC injection device to at least a first and a second electric contact section, and optionally one or more further electric contact sections, extending along a first longitudinal side of the longitudinal extension of the standing wave cavity such that the absolute value of the complex amplitude and/or the phase of the injected electrical AC signal differs for the first and the second electric contact section; and
   the electrical AC signal is injected to one of the first, second and further electric contact sections adjacent to the one end of the standing wave cavity and, optionally:
   i) phase shifted by substantially 180° to another one of the first, second and further electric contact sections adjacent to the other end of the standing wave cavity; or
   ii) to another one of the first, second and further electric contact sections adjacent to the other end of the standing wave cavity and phase shifted by substantially 180° to a yet another of the first, second and further electric contact sections substantially adjacent to a center region of the standing wave cavity in the direction of the longitudinal extension of the standing wave cavity.

2. The method according to claim 1, characterized in that the electrical AC signal is injected into the standing wave cavity such that phases of an individual beat oscillation of adjacent laser lines are locked by repulsive means.

3. The method according to claim 1, characterized in that the electrical AC signal is injected to one or more of the first, second and further electric contact sections of the standing wave cavity corresponding to a local maximum of a defined curve, which corresponds to the spatially dependent amplitude of the electrical laser beat-note or one of its higher harmonics or is a half-pi cosine curve from one end of the standing wave cavity to the other end of the standing wave cavity or one of its higher harmonics.

4. The method according to claim 3, characterized in that the electrical AC signal is injected, phase shifted by substantially 180°, to one or more of the first, second and further electric contact sections of the standing wave cavity corresponding to a local minimum of the defined curve.

5. A method for frequency comb spectroscopy, characterized in that a first laser with a fast gain medium is operated according to claim 1.

6. The method according to claim 5, characterized by the following steps:
   a) emitting a first beam from the first laser;
   b) interacting the first beam with an analyte;
   c) optionally time delaying the first beam;
   d) directing the first beam at the standing wave cavity of the first laser or at a detector;
   e) detecting multiheterodyne beating in the standing wave cavity of the first laser or in the detector; and
   f) repeating steps a) to e) while modulating the frequency of the injected electrical AC signal.

7. The method according to claim 6, characterized by:
   step a) comprising splitting a second beam off the first beam after emitting the first beam from the first laser; and
   step d) comprising directing the second beam at the standing wave cavity of the first laser or at the detector.

8. The method according to claim 5, characterized by:
   operating a second laser with a fast gain medium according to any of claims 1 to 3;
   emitting a first beam from an output of the first laser;
   emitting a second beam from an output of the second laser;
   optionally interacting the first beam and/or the second beam with an analyte;
   directing the first beam into the output of the second laser;
   optionally directing the second beam into the output of the first laser; and
   optionally measuring multiheterodyne beating at least one electric contact section of the first and/or the second laser where the electrical AC signal was injected.

9. The method according to claim 5, characterized by:
   operating a second laser with a fast gain medium according to any of claims 1 to 3;
   emitting a first beam from a first output of the first laser;
   emitting a second beam from a first output of the second laser;
   optionally interacting the first and/or the second beam with an analyte;
   directing the first beam to a first detector;

directing the second beam to the first detector; and
optionally each of the following steps:
  emitting a third beam from a second output of the first laser,
  emitting a fourth beam from a second output of the second laser,
  directing the third beam to a second detector, and
  directing the fourth beam to the second detector.

10. The method according to claim 1, wherein the semiconductor laser comprises a quantum cascade llaser or an interband cascade laser.

11. A laser assembly comprising:
a semiconductor laser with a standing wave cavity and a fast gain medium, wherein a gain relaxation time of the gain medium is smaller than the round-trip time in the standing wave cavity;
a DC source coupled to the standing wave cavity for pumping the laser;
an AC injection device for injecting an electrical AC signal into the standing wave cavity to stabilize an optical frequency comb, the AC injection device being suitable for producing an electrical AC signal within a range and/or within an integer multiple of the range, wherein the range is within ±1% of a natural round-trip frequency in the standing wave cavity;
at least a first and a second electric contact section extending along a first longitudinal side of a longitudinal extension of the standing wave cavity, wherein the AC injection device is coupled to the first and/or to the second electric contact section such that a complex amplitude of the injected electrical AC signal differs for the first and the second longitudinal electric contact section; and wherein:
the AC injection device is coupled to the first and/or the second electric contact section such that an absolute value of the complex amplitude of the injected electrical AC signal differs for the first and the second electric contact section by at least 50%, with respect to the higher absolute value of the complex amplitude; or
the AC injection device is coupled to the first and/or the second electric contact section such that a phase of the injected electrical AC signal differs for the first and the second electric contact section by substantially 180°.

12. The laser assembly according to claim 11, characterized in that:
the AC injection device is coupled to the first and/or the second electric contact section such that an absolute value of the complex amplitude of the injected electrical AC signal differs for the first and the second electric contact section by at least 10% with respect to the higher absolute value of the complex amplitude; or
the AC injection device is coupled to the first and/or the second electric contact section such that a phase of the injected electrical AC signal differs for the first and the second electric contact section by between 90° and 270°.

13. The laser assembly according to claim 11, characterized by an electric contact extending along the first longitudinal side of the longitudinal extension of the standing wave cavity, and optionally essentially over the whole longitudinal extension of the standing wave cavity, wherein the electric contact has at least the first electric contact section and the second electric contact section, and optionally one or more further electric contact sections, wherein the DC source is conductively connected to at least one of, and optionally all of, the first and second electric contact sections, in particular also of the further electric contact sections.

14. The laser assembly according to claim 13, characterized in that the first and the second electric contact section, and optionally also the further electric contact sections, of the electric contact are separated by substantially nonconducting splits in the electric contact.

15. The laser assembly according to claim 13, characterized in that the first and second electric contact sections, and optionally also the further electric contact sections, of the electric contact are continuously connected to one another, wherein a grounded surface and the electric contact form a capacitor with a capacitance, an imaginary part of the complex impedance being such that the absolute value of the complex amplitude of the injected electrical AC signal at an edge of the first and second electric contact sections, and optionally of the further electric contact sections is less than 10% of the absolute value of the complex amplitude of an electrical AC signal injected in a center, in direction of the longitudinal extension of the standing wave cavity, of the respective first, second and optionally further electric contact section.

16. The laser assembly according to claim 15, characterized in that the imaginary part of the complex impedance being such that the absolute value of the complex amplitude of the injected electrical AC signal at the edge of the first and second electric contact sections, and optionally of the further electric contact sections, is less than 5% of the absolute value of the complex amplitude of the electrical AC signal injected in the center, in direction of the longitudinal extension of the standing wave cavity, of the respective first, second and optionally further electric contact section.

17. A spectrometer for frequency comb spectroscopy of an analyte, characterized by a first laser assembly according to claim 11.

18. The laser assembly according to claim 11, wherein:
the AC injection device is coupled to the first and/or the second electric contact section such that an absolute value of the complex amplitude of the injected electrical AC signal differs for the first and the second electric contact section by at least 30% with respect to the higher absolute value of the complex amplitude; or
the AC injection device is coupled to the first and/or the second electric contact section such that a phase of the injected electrical AC signal differs for the first and the second electric contact section by between 135° and 225°.

* * * * *